US009823381B2

(12) United States Patent
Meyer

(10) Patent No.: US 9,823,381 B2
(45) Date of Patent: *Nov. 21, 2017

(54) MAPPING AND MONITORING OF HYDRAULIC FRACTURES USING VECTOR MAGNETOMETERS

(71) Applicant: Lockheed Martin Corporation, Bethesda, MD (US)

(72) Inventor: Thomas J. Meyer, Corfu, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/476,636

(22) Filed: Mar. 31, 2017

(65) Prior Publication Data
US 2017/0205526 A1    Jul. 20, 2017

Related U.S. Application Data

(63) Continuation of application No. 14/659,498, filed on Mar. 16, 2015, now Pat. No. 9,638,821.
(Continued)

(51) Int. Cl.
*E21B 49/00* (2006.01)
*G01V 3/26* (2006.01)
*G01R 33/032* (2006.01)

(52) U.S. Cl.
CPC ............ *G01V 3/26* (2013.01); *G01R 33/032* (2013.01)

(58) Field of Classification Search
CPC .... G01R 33/093; G01R 33/098; G01R 33/07; G01R 33/09; E21B 43/26; E21B 43/267;
(Continued)

(56) References Cited

U.S. PATENT DOCUMENTS 2,746,027 A    5/1956   Murray
3,359,812 A    12/1967  Everitt
(Continued)

FOREIGN PATENT DOCUMENTS

CN    105738845 A    7/2016
DE    69608006 T2    2/2001
(Continued)

OTHER PUBLICATIONS

Bucher et al, "High Resolution Magnetic Resonance Spectroscopy Using Solid-State Spins", May 25, 2017, downloaded from https://arxiv.org/ (arXiv.org > quant-ph > arXiv:1705.08887) on May 25, 2017, pp. 1-24.
(Continued)

*Primary Examiner* — Jermele M Hollington
*Assistant Examiner* — Taqi Nasir
(74) *Attorney, Agent, or Firm* — Foley & Lardner LLP

(57) ABSTRACT

A method for mapping and monitoring of hydraulic fracture includes capturing, using an array of sensors, a first magnetic image of a well pay zone. A second magnetic image is captured using the array of sensors, after a well bore is padded with a fluid. A background is established based on the first and the second magnetic images. A third magnetic image is captured using the array of sensors, after a doped proppant is injected into a stage. The third image is processed to subtract the background and to obtain information regarding distribution of the fluid and the proppant in the stage.

20 Claims, 8 Drawing Sheets

Related U.S. Application Data

(60) Provisional application No. 61/955,918, filed on Mar. 20, 2014.

(58) Field of Classification Search
CPC .......... E21B 43/00; E21B 43/01; E21B 43/14;
E21B 43/166; E21B 47/00; G01V 1/288;
G01V 2210/034; G01V 3/16; G01V 3/38
USPC ....... 324/221, 324, 333, 338, 346, 351, 355,
324/368, 372, 301, 350, 389, 207.21,
324/244–263, 307
See application file for complete search history.

(56) References Cited

U.S. PATENT DOCUMENTS

| | | | |
|---|---|---|---|
| 3,389,333 A | 6/1968 | Wolff et al. |
| 3,490,032 A | 1/1970 | Zurflueh |
| 3,514,723 A | 5/1970 | Cutler |
| 3,518,531 A | 6/1970 | Huggett |
| 3,745,452 A | 7/1973 | Osburn et al. |
| 3,899,758 A | 8/1975 | Maier et al. |
| 4,025,873 A | 5/1977 | Chilluffo |
| 4,078,247 A | 3/1978 | Albrecht |
| 4,084,215 A | 4/1978 | Willenbrock |
| 4,322,769 A | 3/1982 | Cooper |
| 4,329,173 A | 5/1982 | Culling |
| 4,359,673 A | 11/1982 | Bross et al. |
| 4,368,430 A | 1/1983 | Dale et al. |
| 4,410,926 A | 10/1983 | Hafner et al. |
| 4,437,533 A | 3/1984 | Bierkarre et al. |
| 4,514,083 A | 4/1985 | Fukuoka |
| 4,588,993 A | 5/1986 | Babij et al. |
| 4,636,612 A | 1/1987 | Cullen |
| 4,638,324 A | 1/1987 | Hannan |
| 4,675,522 A | 6/1987 | Arunkumar |
| 4,768,962 A | 9/1988 | Kupfer et al. |
| 4,818,990 A | 4/1989 | Fernandes |
| 4,820,986 A | 4/1989 | Mansfield et al. |
| 4,945,305 A | 7/1990 | Blood |
| 4,958,328 A | 9/1990 | Stubblefield |
| 5,019,721 A | 5/1991 | Martens et al. |
| 5,038,103 A | 8/1991 | Scarzello et al. |
| 5,113,136 A | 5/1992 | Hayashi et al. |
| 5,134,369 A | 7/1992 | Lo et al. |
| 5,189,368 A | 2/1993 | Chase |
| 5,200,855 A | 4/1993 | Meredith et al. |
| 5,245,347 A | 9/1993 | Bonta et al. |
| 5,252,912 A | 10/1993 | Merritt et al. |
| 5,301,096 A | 4/1994 | Klontz et al. |
| 5,384,109 A | 1/1995 | Klaveness et al. |
| 5,396,802 A | 3/1995 | Moss |
| 5,420,549 A | 5/1995 | Prestage |
| 5,425,179 A | 6/1995 | Nickel et al. |
| 5,427,915 A | 6/1995 | Ribi et al. |
| 5,548,279 A | 8/1996 | Gaines |
| 5,568,516 A | 10/1996 | Strohallen et al. |
| 5,586,069 A | 12/1996 | Dockser |
| 5,597,762 A | 1/1997 | Popovici et al. |
| 5,638,472 A | 6/1997 | Van Delden |
| 5,694,375 A | 12/1997 | Woodall |
| 5,719,497 A | 2/1998 | Veeser et al. |
| 5,731,996 A | 3/1998 | Gilbert |
| 5,764,061 A | 6/1998 | Asakawa et al. |
| 5,818,352 A | 10/1998 | McClure |
| 5,846,708 A | 12/1998 | Hollis et al. |
| 5,888,925 A | 3/1999 | Smith et al. |
| 5,907,420 A | 5/1999 | Chraplyvy et al. |
| 5,907,907 A | 6/1999 | Ohtomo et al. |
| 6,042,249 A | 3/2000 | Spangenberg |
| 6,057,684 A | 5/2000 | Murakami et al. |
| 6,124,862 A | 9/2000 | Boyken et al. |
| 6,130,753 A | 10/2000 | Hopkins et al. |
| 6,144,204 A | 11/2000 | Sementchenko |
| 6,195,231 B1 | 2/2001 | Sedlmayr et al. |
| 6,360,173 B1 | 3/2002 | Fullerton |
| 6,398,155 B1 | 6/2002 | Hepner et al. |
| 6,433,944 B1 | 8/2002 | Nagao et al. |
| 6,472,651 B1 | 10/2002 | Ukai |
| 6,472,869 B1 | 10/2002 | Upschulte et al. |
| 6,504,365 B2 | 1/2003 | Kitamura |
| 6,542,242 B1 | 4/2003 | Yost et al. |
| 6,621,578 B1 | 9/2003 | Mizoguchi |
| 6,636,146 B1 | 10/2003 | Wehoski |
| 6,686,696 B2 | 2/2004 | Mearini et al. |
| 6,690,162 B1 | 2/2004 | Schopohl et al. |
| 6,765,487 B1 | 7/2004 | Holmes et al. |
| 6,788,722 B1 | 9/2004 | Kennedy et al. |
| 6,809,829 B1 | 10/2004 | Takata et al. |
| 7,118,657 B2 | 10/2006 | Golovchenko et al. |
| 7,221,164 B1 | 5/2007 | Barringer |
| 7,277,161 B2 | 10/2007 | Claus |
| 7,305,869 B1 | 12/2007 | Berman et al. |
| 7,307,416 B2 | 12/2007 | Islam et al. |
| RE40,343 E | 5/2008 | Anderson |
| 7,413,011 B1 | 8/2008 | Chee et al. |
| 7,427,525 B2 | 9/2008 | Santori et al. |
| 7,448,548 B1 | 11/2008 | Compton |
| 7,471,805 B2 | 12/2008 | Goldberg |
| 7,474,090 B2 | 1/2009 | Islam et al. |
| 7,543,780 B1 | 6/2009 | Marshall et al. |
| 7,546,000 B2 | 6/2009 | Spillane et al. |
| 7,570,050 B2 * | 8/2009 | Sugiura ............ G01R 33/56375 324/307 |
| 7,608,820 B1 | 10/2009 | Berman et al. |
| 7,705,599 B2 | 4/2010 | Strack et al. |
| 7,805,030 B2 | 9/2010 | Bratkovski et al. |
| 7,916,489 B2 | 3/2011 | Okuya |
| 7,983,812 B2 | 7/2011 | Potter |
| 8,022,693 B2 | 9/2011 | Meyersweissflog |
| 8,120,351 B2 | 2/2012 | Rettig et al. |
| 8,120,355 B1 | 2/2012 | Stetson |
| 8,138,756 B2 | 3/2012 | Barclay et al. |
| 8,193,808 B2 | 6/2012 | Fu et al. |
| 8,294,306 B2 | 10/2012 | Kumar et al. |
| 8,311,767 B1 | 11/2012 | Stetson |
| 8,334,690 B2 | 12/2012 | Kitching et al. |
| 8,415,640 B2 | 4/2013 | Babinec et al. |
| 8,471,137 B2 | 6/2013 | Adair et al. |
| 8,480,653 B2 | 7/2013 | Birchard et al. |
| 8,525,516 B2 | 9/2013 | Le Prado et al. |
| 8,547,090 B2 | 10/2013 | Lukin et al. |
| 8,574,536 B2 | 11/2013 | Boudou et al. |
| 8,575,929 B1 | 11/2013 | Wiegert |
| 8,686,377 B2 | 4/2014 | Twitchen et al. |
| 8,758,509 B2 | 6/2014 | Twitchen et al. |
| 8,803,513 B2 | 8/2014 | Hosek et al. |
| 8,885,301 B1 | 11/2014 | Heidmann |
| 8,913,900 B2 | 12/2014 | Lukin et al. |
| 8,933,594 B2 | 1/2015 | Kurs |
| 8,947,080 B2 | 2/2015 | Lukin et al. |
| 8,963,488 B2 | 2/2015 | Campanella et al. |
| 9,103,873 B1 | 8/2015 | Martens et al. |
| 9,157,859 B2 | 10/2015 | Walsworth et al. |
| 9,245,551 B2 | 1/2016 | El Hallak et al. |
| 9,249,526 B2 | 2/2016 | Twitchen et al. |
| 9,291,508 B1 | 3/2016 | Biedermann et al. |
| 9,369,182 B2 | 6/2016 | Kurs et al. |
| 9,541,610 B2 | 1/2017 | Kaup et al. |
| 9,551,763 B1 | 1/2017 | Hahn et al. |
| 9,557,391 B2 | 1/2017 | Egan et al. |
| 9,570,793 B2 | 2/2017 | Borodulin |
| 9,590,601 B2 | 3/2017 | Krause et al. |
| 9,614,589 B1 | 4/2017 | Russo et al. |
| 9,680,338 B2 | 6/2017 | Malpas et al. |
| 9,689,679 B2 | 6/2017 | Budker et al. |
| 9,720,055 B1 | 8/2017 | Hahn et al. |
| 2002/0144093 A1 | 10/2002 | Inoue et al. |
| 2002/0167306 A1 | 11/2002 | Zalunardo et al. |
| 2003/0058346 A1 | 3/2003 | Bechtel et al. |
| 2003/0076229 A1 | 4/2003 | Blanpain et al. |
| 2003/0098455 A1 | 5/2003 | Amin et al. |
| 2003/0235136 A1 | 12/2003 | Akselrod et al. |
| 2004/0013180 A1 | 1/2004 | Giannakis et al. |
| 2004/0022179 A1 | 2/2004 | Giannakis et al. |

(56) References Cited

U.S. PATENT DOCUMENTS

| | | |
|---|---|---|
| 2004/0042150 A1 | 3/2004 | Swinbanks et al. |
| 2004/0081033 A1 | 4/2004 | Arieli et al. |
| 2004/0109328 A1 | 6/2004 | Dahl et al. |
| 2004/0247145 A1 | 12/2004 | Luo et al. |
| 2005/0031840 A1 | 2/2005 | Swift et al. |
| 2005/0068249 A1 | 3/2005 | Frederick Du Toit et al. |
| 2005/0099177 A1 | 5/2005 | Greelish |
| 2005/0112594 A1 | 5/2005 | Grossman |
| 2005/0126905 A1 | 6/2005 | Golovchenko et al. |
| 2005/0130601 A1 | 6/2005 | Palermo et al. |
| 2005/0134257 A1 | 6/2005 | Etherington et al. |
| 2005/0138330 A1 | 6/2005 | Owens et al. |
| 2005/0146327 A1 | 7/2005 | Jakab |
| 2006/0012385 A1 | 1/2006 | Tsao et al. |
| 2006/0054789 A1 | 3/2006 | Miyamoto et al. |
| 2006/0055584 A1 | 3/2006 | Waite et al. |
| 2006/0062084 A1* | 3/2006 | Drew ............ G01V 1/008 367/68 |
| 2006/0071709 A1 | 4/2006 | Maloberti et al. |
| 2006/0247847 A1 | 11/2006 | Carter et al. |
| 2006/0255801 A1* | 11/2006 | Ikeda ............ G01R 33/54 324/307 |
| 2006/0291771 A1 | 12/2006 | Braunisch et al. |
| 2007/0004371 A1 | 1/2007 | Okanobu |
| 2007/0247147 A1 | 10/2007 | Xiang et al. |
| 2007/0273877 A1 | 11/2007 | Kawano et al. |
| 2008/0016677 A1 | 1/2008 | Creighton, IV |
| 2008/0048640 A1 | 2/2008 | Hull et al. |
| 2008/0078233 A1 | 4/2008 | Larson et al. |
| 2008/0089367 A1 | 4/2008 | Srinivasan et al. |
| 2008/0204004 A1 | 8/2008 | Anderson |
| 2008/0217516 A1 | 9/2008 | Suzuki et al. |
| 2008/0239265 A1 | 10/2008 | Den Boef |
| 2008/0253264 A1 | 10/2008 | Nagatomi et al. |
| 2008/0266050 A1 | 10/2008 | Crouse et al. |
| 2008/0299904 A1 | 12/2008 | Yi et al. |
| 2009/0042592 A1 | 2/2009 | Cho et al. |
| 2009/0058697 A1 | 3/2009 | Aas et al. |
| 2009/0060790 A1 | 3/2009 | Okaguchi et al. |
| 2009/0079417 A1 | 3/2009 | Mort et al. |
| 2009/0079426 A1 | 3/2009 | Anderson |
| 2009/0132100 A1 | 5/2009 | Shibata |
| 2009/0157331 A1 | 6/2009 | Van Netten |
| 2009/0195244 A1* | 8/2009 | Mouget ............ G01V 3/28 324/221 |
| 2009/0222208 A1 | 9/2009 | Speck |
| 2009/0277702 A1 | 11/2009 | Kanada et al. |
| 2009/0310650 A1 | 12/2009 | Chester et al. |
| 2010/0004802 A1 | 1/2010 | Bodin et al. |
| 2010/0015438 A1 | 1/2010 | Williams et al. |
| 2010/0015918 A1 | 1/2010 | Liu et al. |
| 2010/0045269 A1 | 2/2010 | Lafranchise et al. |
| 2010/0071904 A1 | 3/2010 | Burns et al. |
| 2010/0102809 A1 | 4/2010 | May |
| 2010/0134922 A1 | 6/2010 | Yamada et al. |
| 2010/0157305 A1 | 6/2010 | Henderson |
| 2010/0188081 A1 | 7/2010 | Lammegger |
| 2010/0237149 A1 | 9/2010 | Olmstead |
| 2010/0271016 A1 | 10/2010 | Barclay et al. |
| 2010/0277121 A1 | 11/2010 | Hall et al. |
| 2010/0308813 A1 | 12/2010 | Lukin et al. |
| 2010/0315079 A1 | 12/2010 | Lukin et al. |
| 2010/0326042 A1 | 12/2010 | McLean et al. |
| 2011/0034393 A1 | 2/2011 | Justen et al. |
| 2011/0059704 A1 | 3/2011 | Norimatsu et al. |
| 2011/0062957 A1 | 3/2011 | Fu et al. |
| 2011/0066379 A1 | 3/2011 | Mes |
| 2011/0120890 A1 | 5/2011 | MacPherson et al. |
| 2011/0127999 A1 | 6/2011 | Lott et al. |
| 2011/0153339 A1 | 6/2011 | Buck et al. |
| 2011/0165862 A1 | 7/2011 | Yu et al. |
| 2011/0176563 A1 | 7/2011 | Friel et al. |
| 2011/0243267 A1 | 10/2011 | Won et al. |
| 2011/0270078 A1 | 11/2011 | Wagenaar et al. |
| 2012/0016538 A1 | 1/2012 | Waite et al. |
| 2012/0019242 A1 | 1/2012 | Hollenberg et al. |
| 2012/0037803 A1 | 2/2012 | Strickland |
| 2012/0044014 A1 | 2/2012 | Stratakos et al. |
| 2012/0051996 A1 | 3/2012 | Scarsbrook et al. |
| 2012/0063505 A1 | 3/2012 | Okamura et al. |
| 2012/0087449 A1 | 4/2012 | Ling et al. |
| 2012/0089299 A1 | 4/2012 | Breed |
| 2012/0140219 A1 | 6/2012 | Cleary |
| 2012/0181020 A1* | 7/2012 | Barron ............ B01J 13/02 166/250.1 |
| 2012/0194068 A1 | 8/2012 | Cheng et al. |
| 2012/0203086 A1 | 8/2012 | Rorabaugh et al. |
| 2012/0232838 A1 | 9/2012 | Kemppi et al. |
| 2012/0235633 A1 | 9/2012 | Kesler et al. |
| 2012/0235634 A1 | 9/2012 | Hall et al. |
| 2012/0245885 A1 | 9/2012 | Kimishima |
| 2012/0257683 A1 | 10/2012 | Schwager et al. |
| 2012/0281843 A1 | 11/2012 | Christensen et al. |
| 2012/0326793 A1 | 12/2012 | Gan |
| 2013/0043863 A1 | 2/2013 | Ausserlechner et al. |
| 2013/0093424 A1 | 4/2013 | Blank et al. |
| 2013/0127518 A1 | 5/2013 | Nakao |
| 2013/0179074 A1 | 7/2013 | Haverinen |
| 2013/0215712 A1 | 8/2013 | Geiser et al. |
| 2013/0223805 A1 | 8/2013 | Ouyang et al. |
| 2013/0265782 A1 | 10/2013 | Barrena et al. |
| 2013/0270991 A1 | 10/2013 | Twitchen et al. |
| 2013/0279319 A1 | 10/2013 | Matozaki et al. |
| 2014/0012505 A1 | 1/2014 | Smith et al. |
| 2014/0037932 A1 | 2/2014 | Twitchen et al. |
| 2014/0044208 A1 | 2/2014 | Woodsum |
| 2014/0061510 A1 | 3/2014 | Twitchen et al. |
| 2014/0070622 A1 | 3/2014 | Keeling et al. |
| 2014/0072008 A1 | 3/2014 | Faraon et al. |
| 2014/0077231 A1 | 3/2014 | Twitchen et al. |
| 2014/0081592 A1 | 3/2014 | Bellusci et al. |
| 2014/0104008 A1 | 4/2014 | Gan |
| 2014/0126334 A1 | 5/2014 | Megdal et al. |
| 2014/0139322 A1 | 5/2014 | Wang et al. |
| 2014/0154792 A1 | 6/2014 | Moynihan et al. |
| 2014/0159652 A1 | 6/2014 | Hall et al. |
| 2014/0166904 A1 | 6/2014 | Walsworth et al. |
| 2014/0167759 A1* | 6/2014 | Pines ............ G01N 24/081 324/322 |
| 2014/0168174 A1 | 6/2014 | Idzik et al. |
| 2014/0180627 A1 | 6/2014 | Naguib et al. |
| 2014/0191139 A1 | 7/2014 | Englund |
| 2014/0191752 A1 | 7/2014 | Walsworth et al. |
| 2014/0198463 A1 | 7/2014 | Klein |
| 2014/0210473 A1 | 7/2014 | Campbell et al. |
| 2014/0215985 A1 | 8/2014 | Pollklas |
| 2014/0247094 A1 | 9/2014 | Englund et al. |
| 2014/0265555 A1 | 9/2014 | Hall et al. |
| 2014/0272119 A1 | 9/2014 | Kushalappa et al. |
| 2014/0273826 A1 | 9/2014 | Want et al. |
| 2014/0291490 A1 | 10/2014 | Hanson et al. |
| 2014/0297067 A1 | 10/2014 | Malay |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1 | 1/2015 | Englund et al. |
| 2015/0009746 A1 | 1/2015 | Kucsko et al. |
| 2015/0018018 A1 | 1/2015 | Shen et al. |
| 2015/0022404 A1 | 1/2015 | Chen et al. |
| 2015/0048822 A1 | 2/2015 | Walsworth et al. |
| 2015/0054355 A1 | 2/2015 | Ben-Shalom et al. |
| 2015/0061590 A1 | 3/2015 | Widmer et al. |
| 2015/0090033 A1 | 4/2015 | Budker et al. |
| 2015/0128431 A1 | 5/2015 | Kuo |
| 2015/0137793 A1 | 5/2015 | Englund et al. |
| 2015/0153151 A1 | 6/2015 | Kochanski |
| 2015/0192532 A1 | 7/2015 | Clevenson et al. |
| 2015/0192596 A1 | 7/2015 | Englund et al. |
| 2015/0225052 A1 | 8/2015 | Cordell |
| 2015/0235661 A1 | 8/2015 | Heidmann |
| 2015/0253355 A1 | 9/2015 | Grinolds et al. |
| 2015/0268373 A1 | 9/2015 | Meyer |

(56) References Cited

U.S. PATENT DOCUMENTS

| | | |
|---|---|---|
| 2015/0269957 A1 | 9/2015 | El Hallak et al. |
| 2015/0276897 A1 | 10/2015 | Leussler et al. |
| 2015/0299894 A1 | 10/2015 | Markham et al. |
| 2015/0303333 A1 | 10/2015 | Yu et al. |
| 2015/0314870 A1 | 11/2015 | Davies |
| 2015/0326030 A1 | 11/2015 | Malpas et al. |
| 2015/0326410 A1 | 11/2015 | Krause et al. |
| 2015/0374250 A1 | 12/2015 | Hatano et al. |
| 2015/0377865 A1 | 12/2015 | Acosta et al. |
| 2015/0377987 A1 | 12/2015 | Menon et al. |
| 2016/0031339 A1 | 2/2016 | Geo |
| 2016/0036529 A1 | 2/2016 | Griffith et al. |
| 2016/0071532 A9 | 3/2016 | Heidmann |
| 2016/0077167 A1 | 3/2016 | Heidmann |
| 2016/0097702 A1 | 4/2016 | Zhao et al. |
| 2016/0139048 A1 | 5/2016 | Heidmann |
| 2016/0146904 A1 | 5/2016 | Stetson, Jr. et al. |
| 2016/0161429 A1 | 6/2016 | Englund et al. |
| 2016/0214714 A1 | 7/2016 | Sekelsky |
| 2016/0216304 A1 | 7/2016 | Sekelsky |
| 2016/0216340 A1 | 7/2016 | Egan et al. |
| 2016/0216341 A1 | 7/2016 | Boesch et al. |
| 2016/0221441 A1 | 8/2016 | Hall et al. |
| 2016/0223621 A1 | 8/2016 | Kaup et al. |
| 2016/0231394 A1 | 8/2016 | Manickam et al. |
| 2016/0266220 A1 | 9/2016 | Sushkov et al. |
| 2016/0291191 A1 | 10/2016 | Fukushima et al. |
| 2016/0313408 A1 | 10/2016 | Hatano et al. |
| 2016/0348277 A1 | 12/2016 | Markham et al. |
| 2016/0356863 A1 | 12/2016 | Boesch et al. |
| 2017/0010214 A1 | 1/2017 | Osawa et al. |
| 2017/0010334 A1 | 1/2017 | Krause et al. |
| 2017/0010338 A1 | 1/2017 | Bayat et al. |
| 2017/0010594 A1 | 1/2017 | Kottapalli et al. |
| 2017/0023487 A1 | 1/2017 | Boesch |
| 2017/0068012 A1 | 3/2017 | Fisk |
| 2017/0104426 A1 | 4/2017 | Mills |
| 2017/0199156 A1 | 7/2017 | Villani et al. |
| 2017/0207823 A1 | 7/2017 | Russo et al. |
| 2017/0211947 A1 | 7/2017 | Fisk |
| 2017/0212046 A1 | 7/2017 | Cammerata |
| 2017/0212177 A1 | 7/2017 | Coar et al. |
| 2017/0212178 A1 | 7/2017 | Hahn et al. |
| 2017/0212179 A1 | 7/2017 | Hahn et al. |
| 2017/0212180 A1 | 7/2017 | Hahn et al. |
| 2017/0212181 A1 | 7/2017 | Coar et al. |
| 2017/0212182 A1 | 7/2017 | Hahn et al. |
| 2017/0212183 A1 | 7/2017 | Egan et al. |
| 2017/0212184 A1 | 7/2017 | Coar et al. |
| 2017/0212185 A1 | 7/2017 | Hahn et al. |
| 2017/0212186 A1 | 7/2017 | Hahn et al. |
| 2017/0212187 A1 | 7/2017 | Hahn et al. |
| 2017/0212190 A1 | 7/2017 | Reynolds et al. |
| 2017/0212258 A1 | 7/2017 | Fisk |

FOREIGN PATENT DOCUMENTS

| | | | |
|---|---|---|---|
| DE | 19600241 C2 | 8/2002 | |
| DE | 10228536 A1 | 1/2003 | |
| EP | 0 161 940 B1 | 12/1990 | |
| EP | 0 718 642 | 6/1996 | |
| EP | 0 726 458 | 8/1996 | |
| EP | 1 505 627 | 2/2005 | |
| EP | 1 685 597 | 8/2006 | |
| EP | 1 990 313 | 11/2008 | |
| EP | 2 163 392 | 3/2010 | |
| EP | 2 495 166 A1 | 9/2012 | |
| EP | 2 587 232 A1 | 5/2013 | |
| EP | 2 705 179 | 3/2014 | |
| EP | 2 707 523 | 3/2014 | |
| EP | 2 745 360 | 6/2014 | |
| EP | 2 769 417 | 8/2014 | |
| EP | 2 790 031 | 10/2014 | |
| EP | 2 837 930 A1 | 2/2015 | |
| EP | 2 907 792 | 8/2015 | |
| GB | 2 423 366 A | 8/2006 | |
| GB | 2 433 737 | 7/2007 | |
| GB | 2 482 596 | 2/2012 | |
| GB | 2 483 767 | 3/2012 | |
| GB | 2 486 794 | 6/2012 | |
| GB | 2 490 589 | 11/2012 | |
| GB | 2 491 936 | 12/2012 | |
| GB | 2 493 236 | 1/2013 | |
| GB | 2 495 632 A | 4/2013 | |
| GB | 2 497 660 | 6/2013 | |
| GB | 2 510 053 A | 7/2014 | |
| GB | 2 515 226 | 12/2014 | |
| GB | 2 522 309 | 7/2015 | |
| GB | 2 526 639 | 12/2015 | |
| JP | 3782147 B2 | 6/2006 | |
| JP | 4800896 B2 | 10/2011 | |
| JP | 2012-103171 | 5/2012 | |
| JP | 2012-110489 | 6/2012 | |
| JP | 2012-121748 | 6/2012 | |
| JP | 2013-028497 | 2/2013 | |
| JP | 5476206 B2 | 4/2014 | |
| JP | 5522606 B2 | 6/2014 | |
| JP | 5536056 B2 | 7/2014 | |
| JP | 5601183 B2 | 10/2014 | |
| JP | 2014-215985 | 11/2014 | |
| JP | 2014-216596 | 11/2014 | |
| JP | 2015-518562 A | 7/2015 | |
| JP | 5764059 B2 | 8/2015 | |
| JP | 2015-167176 | 9/2015 | |
| JP | 2015-529328 | 10/2015 | |
| JP | 5828036 B2 | 12/2015 | |
| JP | 5831947 B2 | 12/2015 | |
| WO | WO-87/04028 A1 | 7/1987 | |
| WO | WO-88/04032 A1 | 6/1988 | |
| WO | WO-95/33972 A1 | 12/1995 | |
| WO | WO-2011/046403 A2 | 4/2011 | |
| WO | WO 2011153339 A1 * | 12/2011 | ............. G01V 3/087 |
| WO | WO-2012/016977 A2 | 2/2012 | |
| WO | WO-2012/084750 | 6/2012 | |
| WO | WO-2013/059404 A1 | 4/2013 | |
| WO | WO-2013/066446 A1 | 5/2013 | |
| WO | WO-2013/066448 | 5/2013 | |
| WO | WO-2013/093136 A1 | 6/2013 | |
| WO | WO-2013/188732 A1 | 12/2013 | |
| WO | WO-2013/190329 A1 | 12/2013 | |
| WO | WO-2014/011286 A2 | 1/2014 | |
| WO | WO-2014/099110 A2 | 6/2014 | |
| WO | WO-2014/135544 A1 | 9/2014 | |
| WO | WO-2014/135547 A1 | 9/2014 | |
| WO | WO-2014/166883 A1 | 10/2014 | |
| WO | WO-2014/210486 A1 | 12/2014 | |
| WO | WO-2015/015172 A1 | 2/2015 | |
| WO | WO-2015/142945 | 9/2015 | |
| WO | WO-2015/157110 A1 | 10/2015 | |
| WO | WO-2015/157290 A1 | 10/2015 | |
| WO | WO-2015/158383 A1 | 10/2015 | |
| WO | WO-2015/193156 A1 | 12/2015 | |
| WO | WO-2016/075226 A1 | 5/2016 | |
| WO | WO-2016/118756 A1 | 7/2016 | |
| WO | WO-2016/118791 A1 | 7/2016 | |
| WO | WO-2016/122965 A1 | 8/2016 | |
| WO | WO-2016/122966 A1 | 8/2016 | |
| WO | WO-2016/126435 A1 | 8/2016 | |
| WO | WO-2016/126436 A1 | 8/2016 | |
| WO | WO-2016/190909 A2 | 12/2016 | |
| WO | WO-2017/007513 A1 | 1/2017 | |
| WO | WO-2017/007514 A1 | 1/2017 | |
| WO | WO-2017/014807 A1 | 1/2017 | |
| WO | WO-2017/039747 A1 | 3/2017 | |
| WO | WO-2017/095454 A1 | 6/2017 | |
| WO | WO-2017/127079 A1 | 7/2017 | |
| WO | WO-2017/127080 A1 | 7/2017 | |
| WO | WO-2017/127081 A1 | 7/2017 | |
| WO | WO-2017/127085 A1 | 7/2017 | |
| WO | WO-2017/127090 A1 | 7/2017 | |
| WO | WO-2017/127091 A1 | 7/2017 | |
| WO | WO-2017/127093 A1 | 7/2017 | |
| WO | WO-2017/127094 A1 | 7/2017 | |
| WO | WO-2017/127095 A1 | 7/2017 | |

(56) References Cited

FOREIGN PATENT DOCUMENTS

| WO | WO-2017/127096 A1 | 7/2017 |
| WO | WO-2017/127097 A1 | 7/2017 |
| WO | WO-2017/127098 A1 | 7/2017 |

OTHER PUBLICATIONS

International Search Report and Written Opinion of the International Searching Authority dated Jul. 14, 2017, from related PCT application PCT/US2017/022118, 13 pages.
International Search Report and Written Opinion of the International Searching Authority dated Jul. 17, 2017, from related PCT application PCT/US2017/024177, 11 pages.
International Search Report and Written Opinion of the International Searching Authority dated Jul. 18, 2017, from related PCT application PCT/US2017/024167, 11 pages.
International Search Report and Written Opinion of the International Searching Authority dated Jul. 18, 2017, from related PCT application PCT/US2017/024173, 13 pages.
International Search Report and Written Opinion of the International Searching Authority dated Jul. 19, 2017, from related PCT application PCT/US2017/024171, 12 pages.
U.S. Notice of Allowance dated Aug. 11, 2017 from related U.S. Appl. No. 15/003,558, 5 pages.
U.S. Notice of Allowance dated Jul. 18, 2017 from related U.S. Appl. No. 15/003,634, 6 pages.
U.S. Notice of Allowance dated Jul. 24, 2017 from related U.S. Appl. No. 15/003,088, 12 pages.
U.S. Office Action dated Aug. 15, 2017 from related U.S. Appl. No. 15/003,281, 12 pages.
U.S. Office Action dated Jul. 27, 2017 from related U.S. Appl. No. 15/003,577, 15 pages.
"Diamond Sensors, Detectors, and Quantum Devices' in Patent Application Approval Process," Chemicals & Chemistry, pp. 1-6, (Feb. 28, 2014), 6 pages.
"Findings from University of Stuttgart in physics reported," Science Letter, (Jul. 7, 2009), 2 pages.
"New Findings on Nitrogen from Ecole Normale Superieure Summarized (Magnetic imaging with an ensemble of nitrogen vacancy-centers in diamond)," Physics Week, pp. 1-2, (Jul. 21, 2015), 2 pages.
"Patent Issued for Diamond Sensors, Detectors, and Quantum Devices (U.S. Pat. No. 9,249,526)," Journal of Engineering, pp. 1-5 (Feb. 15, 2016), 5 pages.
"Researchers Submit Patent Application, 'Diamond Sensors, Detectors, and Quantum Devices', for Approval," Chemicals & Chemistry, pp. 1-7, (Apr. 11, 2014), 7 pages.
Acosta et al., "Broadband magnetometry by infrared-absorption detection of nitrogen-vacancy ensembles in diamond," Appl. Phys. Letters 97: 174104 (Oct. 29, 2010), 4 pages.
Acosta et al., "Diamonds with a high density of nitrogen-vacancy centers for magnetometry applications," Physical Review B 80(115202): 1-15 (Sep. 9, 2009), 15 pages.
Acosta et al., "Nitrogen-vacancy centers: physics and applications," MRS Bulletin 38(2): 127-130 (Feb. 2013), 4 pages.
Acosta, "Optical Magnetometry with Nitrogen-Vacancy Centers in Diamond," University of California Berkeley, (Spring 2011), 118 pages.
Aiello et al., "Composite-pulse magnetometry with a solid-state quantum sensor," Nature Communications 4(1419): 1-6 (Jan. 29, 2013), 6 pages.
Alam, "Solid-state 13C magic angle spinning NMR spectroscopy characterization of particle size structural variations in synthetic nanodiamonds," Materials Chemistry and Physics 85(2-3): 310-315 (Jun. 15, 2004), 6 pages.
Albrecht et al., "Coupling of nitrogen vacancy centres in nanodiamonds by means of phonons," New Journal of Physics 15(083014): 1-26 (Aug. 6, 2013), 27 pages.

Appel et al., "Nanoscale microwave imaging with a single electron spin in diamond," New Journal of Physics 17(112001): 1-6 (Nov. 3, 2015), 7 pages.
Arai et al., "Fourier magnetic imaging with nanoscale resolution and compressed sensing speed-up using electronic spins in diamond," Nature Nanotechnology 10: 859-864 (Aug. 10, 2015), 7 pages.
Aslam et al., "Single spin optically detected magnetic resonance with 60-90 GHz (E-band) microwave resonators," Review of Scientific Instruments 86(064704): 1-8 (Jun. 22, 2015), 9 pages.
Awschalom et al., "Diamond age of spintronics," Scientific American 297: 84-91 (Oct. 2007), 8 pages.
Babamoradi et al., "Correlation between entanglement and spin density in nitrogen-vacancy center of diamond," European Physical Journal D 65: 597-603 (Dec. 1, 2011), 7 pages.
Babunts et al., "Diagnostics of NV defect structure orientation in diamond using optically detected magnetic resonance with a modulated magnetic field," Technical Physics Letters 41(6): 583-586 (Jun. 2015; first published online Jul. 14, 2015), 4 pages.
Babunts et al., "Temperature-scanned magnetic resonance and the evidence of two-way transfer of a nitrogen nuclear spin hyperfine interaction in coupled NV-N pairs in diamond," JETP Letters 95(8): 429-432 (Jun. 27, 2012), 4 pages.
Bagguley et al., "Zeeman effect of acceptor states in semiconducting diamond," Journal of the Physical Society of Japan 21(Supplement): 244-248 (1966), 7 pages.
Balasubramanian et al., "Nanoscale imaging magnetometry with diamond spins under ambient conditions," Nature 455: 648-651 (Oct. 2, 2008), 5 pages.
Balmer et al., "Chemical Vapour deposition synthetic diamond: materials technology and applications," J. of Physics: Condensed Matter 21(36): 1-51 (Aug. 19, 2009), 51 pages.
Baranov et al., "Enormously High Concentrations of Fluorescent Nitrogen-Vacancy Centers Fabricated by Sintering of Detonation Nanodiamonds," Small 7(11): 1533-1537 (Jun. 6, 2011; first published online Apr. 26, 2011), 5 pages.
Barfuss et al., "Strong mechanical driving of a single electron spin," Nature Physics 11: 820-824 (Aug. 3, 2015), 6 pages.
Barry et al., "Optical magnetic detection of single-neuron action potentials using quantum defects in diamond," as submitted to Quantum Physics on Feb. 2, 2016, 23 pages.
Bennett et al., "CVD Diamond for High Power Laser Applications," SPIE 8603, High-Power Laser Materials Processing: Lasers, Beam Delivery, Diagnostics, and Applications II, 860307 (Feb. 22, 2013), 10 pages.
Berman & Chernobrod, "Single-spin microscope with sub-nanoscale resolution based on optically detected magnetic resonance," SPIE 7608, Quantum Sensing and Nanophotonic Devices VII, 76080Y (Jan. 23, 2010), 4 pages.
Berman et al. "Measurement of single electron and nuclear spin states based on optically detected magnetic resonance," J. Physics: Conf. Series 38: 167-170 (2006), 5 pages.
Blakley et al., "Room-temperature magnetic gradiometry with fiber-coupled nitrogen-vacancy centers in diamond," Optics Letters 40(16): 3727-3730 (Aug. 5, 2015), 4 pages.
Bourgeois, et al., "Photoelectric detection of electron spin resonance of nitrogen-vacancy centres in diamond," Nature Communications 6(8577): 1-8 (Oct. 21, 2015), 8 pages.
Brenneis, et al. "Ultrafast electronic readout of diamond nitrogen-vacancy centres coupled to graphene." Nature nanotechnology 10.2 (2015): 135-139.
Budker & Kimball, "Optical Magnetometry," Cambridge Press, (2013), 11 pages.
Budker & Romalis, "Optical Magnetometry," Nature Physics 3: 227-243 (Apr. 2007), 8 pages.
Casanova, et al., "Effect of magnetic field on phosphorus centre in diamond," Physica Status Solidi A 186(2): 291-295 (Jul. 30, 2001), 6 pages.
Castelletto, et al., "Frontiers in diffraction unlimited optical methods for spin manipulation, magnetic field sensing and imaging using diamond nitrogen vacancy defects," Nanophotonics 1(2): 139-153 (Nov. 2012), 15 pages.

(56) References Cited

OTHER PUBLICATIONS

Chapman, et al., "Anomalous saturation effects due to optical spin depolarization in nitrogen-vacancy centers in diamond nanocrystals," Physical Review B 86(045204): 1-8 (Jul. 10, 2012), 8 pages.
Chavez, et al. "Detecting Arctic oil spills with NMR: a feasibility study." Near Surface Geophysics 13.4 (Feb. 2015): 409-416.
Chen et al., "Vector magnetic field sensing by a single nitrogen vacancy center in diamond," EPL 101(67003): 1-5 (Mar. 2013), 6 pages.
Chernobrod et al., "Improving the sensitivity of frequency modulation spectroscopy using nanomechanical cantilevers," Applied Physics Letters 85(17): 3896-3898 (Oct. 25, 2004), 3 pages.
Chernobrod et al., "Spin Microscope Based on Optically Detected Magnetic Resoncance," Journal of Applied Physics 97(014903): 1-3, (2005; first published online Dec. 10, 2004), 4 pages.
Childress et al., "Coherent dynamics of coupled electron and nuclear spin qubits in diamond," Science 314(5797): 281-285 (Oct. 13, 2006), 6 pages.
Chipaux et al., "Magnetic imaging with an ensemble of nitrogen vacancy-centers in diamond," European Physical Journal D 69(166): 1-10 (Jul. 2, 2015), 10 pages.
Chipaux et al., "Nitrogen vacancies (NV) centers in diamond for magnetic sensors and quantum sensing," SPIE 9370, Quantum Sensing and Nanophotonic Devices XII, 93701V (Feb. 8, 2015), 6 pages.
Chipaux, et al., "Wide bandwidth instantaneous radio frequency spectrum analyzer based on nitrogen vacancy centers in diamond," Applied Physics Letters 107(233502): 1-5 (2015), 6 pages.
Clevenson et al., "Broadband magnetometry and temperature sensing with a light-trapping diamond waveguide," Nature Physics 11: 393-397 (May 2015; first published online Apr. 6, 2015), 6 pages.
Constable, "Geomagnetic Spectrum, Temporal." In Encyclopedia of Geomagnetism and Paleomagnetism, pp. 353-355, Springer: Dordrecht, Netherlands (2007), 3 pages.
Cooper et al., "Time-resolved magnetic sensing with electronic spins in diamond," Nature Communications 5:3141: 1-7 (Jan. 24, 2014), 7 pages.
Creedon et al., "Strong coupling between P1 diamond impurity centers and a three-dimensional lumped photonic microwave cavity," Physical Review B 91(140408R): 1-5 (Apr. 24, 2015), 5 pages
Dale, et al. "Medical applications of diamond magnetometry: commercial viability." arXiv preprint arXiv:1705.01994 (May 8, 2017), pp. 1-7.
Davies, "Current problems in diamond: towards a quantitative understanding," Physica B 273-274: 15-13 (Dec. 15, 1999), 9 pages.
De Lange et al., "Single-Spin Magnetometry with Multipulse Sensing Sequences," Physical Review Letters 106(080802): 1-4 (Feb. 24, 2011), 4 pages.
Degen, "Scanning magnetic field microscope with a diamond single-spin sensor," Applied Physics Letters 92(243111): 1-3 (Jun. 17, 2008), 3 pages.
Delacroix et al., "Design, manufacturing, and performance analysis of mid-infrared achromatic half-wave plates with diamond subwavelength gratings," Applied Optics 51(24): 5897-5902 (Aug. 16, 2012), 6 pages.
Denatale et al., "Fabrication and characterization of diamond moth eye antireflective surfaces on Ge," J. of Applied Physics 71: 1388-1393 (Mar. 1992), 8 pages.
Dobrovitski et al., "Quantum Control over Single Spins in Diamond," Annual Review of Condensed Matter Physics 4: 23-50 (Apr. 2013), 30 pages.
Doherty et al., "The nitrogen-vacancy colour centre in diamond," Physics Reports 528: 1-45 (Jul. 1, 2013), 45 pages.
Doherty et al., "Theory of the ground-state spin of the NV-center in diamond," Physical Review B 85(205203): 1-21 (May 3, 2012), 21 pages.
Doi et al., "Pure negatively charged state of the NV center in n-type diamond," Physical Review B 93(081203): 1-6 (Feb. 3, 2016), 6 pages.
Drake et al., "Influence of magnetic field alignment and defect concentration on nitrogen-vacancy polarization in diamond," New Journal of Physics 18(013011): 1-8 (Jan. 2016; first published on Dec. 24, 2015), 9 pages.
Dreau et al., "Avoiding power broadening in optically detected magnetic resonance of single NV defects for enhanced DC magnetic field sensitivity," Physical Review B 84(195204): 1-8 (Nov. 23, 2011), 8 pages.
Dreau et al., "High-resolution spectroscopy of single NV defects coupled with nearby 13C nuclear spins in diamond," Physical Review B 85(134107): 1-7 (Apr. 20, 2012), 7 pages.
Dumeige et al., "Magnetometry with nitrogen-vacancy ensembles in diamond based on infrared absorption in a doubly resonant optical cavity," Physical Review B 87(155202): 1-9 (Apr. 8, 2013), 9 pages.
Epstein et al., "Anisotropic interactions of a single spin and darkspin spectroscopy in diamond," Nature Physics 1:94-98 (Nov. 2005), 5 pages.
Fallah et al., "Multi-sensor approach in vessel magnetic wake imaging," Wave Motion 51(1): 60-76 (Jan. 2014), retrieved from http://www.sciencedirect.com/science/article/pii/S0165212513001133 (Aug. 21, 2016).
Fedotov et al., "High-resolution magnetic field imaging with a nitrogen-vacancy diamond sensor integrated with a photonic-crystal fiber," Optics Letters 41(3): 472-475 (Feb. 1, 2016; published Jan. 25, 2016), 4 pages.
Fedotov et al., "Photonic-crystal-fiber-coupled photoluminescence interrogation of nitrogen vacancies in diamond nanoparticles," Laser Physics Letters 9(2): 151-154 (Feb. 2012; first published online Dec. 2, 2011), 5 pages.
Feng & Wei, "A steady-state spectral method to fit microwave absorptions of NV centers in diamonds: application to sensitive magnetic field sensing," Measurement Science & Technology 25(105102): 1-6 (Oct. 2014; first published online Aug. 29, 2014), 7 pages.
Fologea, et al. "Detecting single stranded DNA with a solid state nanopore." Nano Letters 5.10 (Aug. 15, 2005): 1905-1909.
Freitas, et al., "Solid-State Nuclear Magnetic Resonance (NMR) Methods Applied to the Study of Carbon Materials," Chemistry and Physics of Carbon, vol. 31 (2012), 45 pages.
Gaebel, et al. "Room-temperature coherent coupling of single spins in diamond." Nature Physics 2.6 (May 28, 2006): 408-413.
GB Examination Report from United Kingdom application No. GB 1617438.5 dated Oct. 28, 2016.
GB Examination Report from United Kingdom application No. GB 1618202.4 dated Jan. 10, 2017.
Geiselmann et al., "Fast optical modulation of the fluorescence from a single nitrogen-vacancy centre," Nature Physics 9: 785-789 (Dec. 2013; first published online Oct. 13, 2013), 5 pages.
Gombert & Blasi, "The Moth-Eye Effect-From Fundamentals to Commercial Exploitation," Functional Properties of Bio-Inspired Surfaces: 79-102, (Nov. 2009), 26 pages.
Gong et al., "Generation of Nitrogen-Vacancy Center Pairs in Bulk Diamond by Molecular Nitrogen Implantation," Chinese Physics Letters 33(2)(026105): 1-4 (Feb. 2016), 5 pages.
Gould et al., "An imaging magnetometer for bio-sensing based on nitrogen-vacancy centers in diamond," SPIE 8933, Frontiers in Biological Detection: From Nanosensors to Systems VI, 89330L (Mar. 18, 2014), 8 pages.
Gould et al., "Room-temperature detection of a single 19 nm superparamagnetic nanoparticle with an imaging magnetometer," Applied Physics Letters 105(072406): 1-4 (Aug. 19, 2014), 5 pages.
Gruber et al., "Scanning confocal optical microscopy and magnetic resonance on single defect centers," Science 276(5321): 2012-2014 (Jun. 27, 1997), 4 pages.
Haeberle et al., "Nanoscale nuclear magnetic imaging with chemical contrast," Nature Nanotechnology 10: 125-128 (Feb. 2015; first published online Jan. 5, 2015), 4 pages.
Haihua et al., "Design of wideband anti-reflective sub wavelength nanostructures," Infrared and Laser Engineering 40(2): 267-270 (Feb. 2011), 4 pages.
Hall et al., "Sensing of Fluctuating Nanoscale Magnetic Fields Using Nitrogen-Vacancy Centers in Diamond," Physical Review Letters 103(220802): 1-4 (Nov. 25, 2009), 4 pages.

(56) References Cited

OTHER PUBLICATIONS

Hanson et al., "Coherent Dynamics of a Single Spin Interacting with an Adjustable Spin Bath," Science 320(5874): 352-355 (Apr. 18, 2008), 5 pages.
Hanson et al., "Polarization and Readout of Coupled Single Spins in Diamond," Physical Review Letters 97(087601): 1-4 (Aug. 23, 2006), 4 pages.
Hanson et al., "Room-temperature manipulation and decoherence of a single spin in diamond," Physical Review 74(161203): 1-4 (Oct. 26, 2006), 4 pages.
Hanzawa et al., "Zeeman effect on the zero-phonon line of the NV center in synthetic diamond," Physica B 184(1-4): 137-140 (Feb. 1993), 4 pages.
Heerema, et al. "Graphene nanodevices for DNA sequencing." Nature nanotechnology 11.2 (Feb. 3, 2016): 127-136.
Hegyi & Yablonovitch, "Molecular imaging by optically detected electron spin resonance of nitrogen-vacancies in nanodiamonds," Nano Letters 13(3): 1173-1178 (Mar. 2013; first published online Feb. 6, 2013), 6 pages.
Hegyi & Yablonovitch, "Nanodiamond molecular imaging with enhanced contrast and expanded field of view," Journal of Biomedical Optics 19(1)(011015): 1-8 (Jan. 2014), 9 pages.
Hilser et al., "All-optical control of the spin state in the NV-center in diamond," Physical Review B 86(125204): 1-8 (Sep. 14, 2012), 8 pages.
Hobbs, "Study of the Environmental and Optical Durability of AR Microstructures in Sapphire, ALON, and Diamond," SPIE 7302, Window and Dome Technologies and Materials XI, 73020J (Apr. 27, 2009), 14 pages.
Huebener et al., "ODMR of NV centers in nano-diamonds covered with N@C60," Physica Status Solidi B 245(10): 2013-2017 (Oct. 2008; first published online Sep. 8, 2008), 5 pages.
Huxter et al., "Vibrational and electronic dynamics of nitrogen-vacancy centres in diamond revealed by two-dimensional ultrafast spectroscopy," Nature Physics 9: 744-749 (Sep. 29, 2013), 6 pages.
International Preliminary Report on Patentability dated Oct. 20, 2016 from related PCT application PCT/US2015/024723, 7 pages.
International Search Report and Written Opinion of the International Searching Authority dated Apr. 1, 2016 from related PCT application PCT/US2016/014384, 12 pages.
International Search Report and Written Opinion of the International Searching Authority dated Apr. 11, 2016 from related PCT application PCT/US2016/014376, 12 pages.
International Search Report and Written Opinion of the International Searching Authority dated Apr. 11, 2016 from related PCT application PCT/US2016/014388, 14 pages.
International Search Report and Written Opinion of the International Searching Authority dated Apr. 11, 2016 from related PCT application PCT/US2016/014395, 15 pages.
International Search Report and Written Opinion of the International Searching Authority dated Apr. 4, 2017 from related PCT application PCT/US16/68366, 9 pages.
International Search Report and Written Opinion of the International Searching Authority dated Feb. 15, 2017 from related PCT application PCT/US2016/014390, 20 pages.
International Search Report and Written opinion of the International Searching Authority dated Jul. 12, 2016, from related PCT application PCT/US2016/014287, 14 pages.
International Search Report and Written Opinion of the International Searching Authority dated Jul. 16, 2015, from related PCT application PCT/US2015/24723, 8 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.
International Search Report and Written Opinion of the International Searching Authority dated Jun. 1, 2017, from related PCT application PCT/US17/21811, 9 pages.
International Search Report and Written Opinion of the International Searching Authority dated Jun. 1, 2017, in related PCT application PCT/US17/22279, 20 pages.
International Search Report and Written Opinion of the International Searching Authority dated Jun. 10, 2016 from related PCT application PCT/US2016/014290, 11 pages.
International Search Report and Written Opinion of the International Searching Authority dated Jun. 15, 2017, from related PCT application PCT/US2017/024175, 10 pages.
International Search Report and Written Opinion of the International Searching Authority dated Jun. 2, 2016, from related PCT application PCT/US2016/014386, 14 pages.
International Search Report and Written Opinion of the International Searching Authority dated Jun. 2, 2016, from related PCT application PCT/US2016/014387, 13 pages.
International Search Report and Written Opinion of the International Searching Authority dated Jun. 6, 2016, from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Jun. 9, 2017, from related patent application PCT/US2017/024181, 13 pages.
International Search Report and Written Opinion of the International Searching Authority dated Jun. 9, 2017, from related PCT application PCT/US2017/024179, 9 pages.
International Search Report and Written Opinion of the International Searching Authority dated Mar. 13, 2017 from related PCT application PCT/US2016/68320, 10 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016 from related PCT application PCT/US2016/014363, 8 pages.
International Search Report and Written Opinion of the International Searching Authority dated Mar. 25, 2016 from related PCT application PCT/US2016/014389, 19 pages.
International Search Report and Written Opinion of the International Searching Authority dated Mar. 27, 2017 from related PCT application PCT/US16/68344, 16 pages.
International Search Report and Written Opinion of the International Searching Authority dated Mar. 28, 2016, from related PCT application PCT/US2016/014380, 9 pages.
International Search Report and Written Opinion of the International Searching Authority dated Mar. 28, 2016, from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016 from related PCT application PCT/US2016/014330, 8 pages.
International Search Report and Written Opinion of the International Searching Authority dated Mar. 29, 2016, from related PCT application PCT/US2016/014328, 7 pages.
International Search Report and Written Opinion of the International Searching Authority dated Mar. 29, 2016, from related PCT application PCT/US2016/014385, 11 pages.
International Search Report and Written Opinion of the International Searching Authority dated Mar. 30, 2016 from related PCT application PCT/US2016/014298, 14 pages.

(56) References Cited

OTHER PUBLICATIONS

International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated Mar. 31, 2017 from related PCT application PCT/US2016/066566, 11 pages.
International Search Report and Written Opinion of the International Searching Authority dated May 10, 2017 from related PCT application PCT/US17/19411, 8 pages.
International Search Report and Written Opinion of the International Searching Authority dated May 18, 2017, from related PCT application PCT/US2017/021593, 10 pages.
International Search Report and Written Opinion of the International Searching Authority dated May 19, 2017 from related PCT application PCT/US17/18099, 16 pages.
International Search Report and Written Opinion of the International Searching Authority dated May 26, 2016 from related PCT application PCT/US2016/014331, 15 pages.
International Search Report and Written Opinion of the International Searching Authority dated May 3, 2017 from related PCT application PCT/US2017/018701, 8 pages.
International Search Report and Written Opinion of the International Searching Authority dated May 4, 2017 from related PCT application PCT/US2017/018709, 8 pages.
International Search Report and Written Opinion of the International Searching Authority dated May 8, 2017 from related PCT application PCT/US2017/17321, 17 pages.
International Search Report and Written Opinion of the International Searching Authority dated Sep. 13, 2016, from related PCT application PCT/US16/14377, 11 pages.
International Search Report and Written Opinion of the International Searching Authority dated Jun. 15, 2017 from related PCT application PCT/US2017/024182, 21 pages.
International Search Report and Written Opinion of the International Searching Authority dated Jun. 22, 2017, in related PCT application PCT/US2017/024180, 10 pages.
International Search Report and Written Opinion of the International Searching Authority dated Jun. 5, 2017, from related PCT application PCT/US2017/024169 (11 pages).
International Search Report and Written Opinion of the International Searching Authority dated Jun. 5, 2017, from related PCT application PCT/US2017/024174, 8 pages.
International Search Report and Written Opinion of the International Searching Authority dated Jun. 5, 2017, in related PCT application PCT/US2017/024168 (7 pages).
International Search Report and Written Opinion of the International Searching Authority dated Jun. 6, 2017, from related PCT application PCT/US2017/024172 (9 pages).
International Search Report and Written Opinion of the International Searching Authority dated Jun. 6, 2017, from related PCT application US/2017/024165 (9 pages).
Ivady et al., "Pressure and temperature dependence of the zero-field splitting in the ground state of NV centers in diamond: A first-principles study," Physical Review B 90(235205): 1-8 (Dec. 2014), 8 pages.
Jarmola et al., "Temperature- and Magnetic-Field-Dependent Longitudinal Spin Relaxation in Nitrogen-Vacancy Ensembles in Diamond," Physical Review Letters 108 (197601): 1-5 (May 2012), 5 pages.
Jensen et al., "Light narrowing of magnetic resonances in ensembles of nitrogen-vacancy centers in diamond," Physical Review B 87(014115): 1-10 (Jan. 2013), 10 pages.
Kailath, "Linear Systems," Prentice Hall, (1979), 6 pages.
Karlsson et al., "Diamond micro-optics: microlenses and antireflection structures surfaces for the infrared spectral region," Optics Express 11(5): 502-507 (Mar. 10, 2003), 6 pages.

Keyser "Enhancing nanopore sensing with DNA nanotechnology." Nature nanotechnology 11.2 (Feb. 2016): 106-108.
Khan & Hemmer, "Noise limitation in nano-scale imaging," Proceedings of SPIE vol. 5842: 302-305, (Dec. 2005), 7 pages.
Kim et al., "Electron spin resonance shift and linewidth broadening of nitrogen-vacancy centers in diamond as a function of electron irradiation dose," Applied Physics Letters 101(082410): 1-5 (Aug. 2012), 6 pages.
Kim et al., "Jahn-Teller Splitting and Zeeman Effect of Acceptors in Diamond," Physica B 273-274: 647-627 (Jul. 1999), 4 pages.
Kim et al., "Magnetospectroscopy of acceptors in 'blue' diamonds," Physica B 302-301: 88-100 (Aug. 2001), 13 pages.
Kim et al., "Zeeman effect of electronic Raman lines of accepters in elemental semiconductors: Boron in blue diamond," Physical Review B 62(12): 8038-8052 (Sep. 2000), 15 pages.
King et al., "Optical polarization of 13C nuclei in diamond through nitrogen vacancy centers," Physical Review B 81(073201): 1-4 (Feb. 2010), 4 pages.
Kok et al., "Materials Science: Qubits in the pink," Nature 444(2): 49 (Nov. 2006), 1 page.
Konenko et al., "Formation of antireflective surface structures on diamond films by laser patterning," Applied Physics A 68:99-102 (Jan. 1999), 4 pages.
Kraus et al., "Magnetic field and temperature sensing with atomic-scale spin defects in silicon carbide," Scientific Reports 4(5303): 1-8 (Jul. 2014), 8 pages.
Lai et al., "Influence of a static magnetic field on the photoluminescence of an ensemble of nitrogen vacancy color centers in a diamond single-crystal," Applied Physics Letters 95, (Sep. 2009), 4 pages.
Lai et al., "Optically detected magnetic resonance of a single Nitrogen-Vacancy electronic spin in diamond nanocrystals," CLEO/EQEC, (Jun. 14-19, 2009), 1 page.
Laraoui et al., "Nitrogen-vacancy assisted magnetometry of paramagnetic centers in an individual diamond nanocrystal," Nano Letters 12: 3477-3482 (Jul. 2012), 6 pages.
Lazariev et al., "A nitrogen-vacancy spin based molecular structure microscope using multiplexed projection reconstruction," Scientific Reports 5(14130): 1-8 (Sep. 2015), 8 pages.
Le Sage et al., "Efficient photon detection from color centers in a diamond optical waveguide," Phys. Rev. B 85: 121202(R), pp. 121202-1- 21202-4, (Mar. 23, 2012), 4 pages.
Lee et al., "Vector magnetometry based on S=3/2 electronic spins," Physical Review B 92 (115201): 1-7 (Sep. 2015), 7 pages.
Lesik et al., "Preferential orientation of NV defects in CVD diamond films grown on (113)-oriented substrates," Diamond and Related Materials 56: 47-53 (Jun. 2015), 7 pages.
Levchenko et al., "Inhomogeneous broadening of optically detected magnetic resonance of the ensembles of nitrogen-vacancy centers in diamond by interstitial carbon atoms," Applied Physics Letters 106, (Mar. 2015; published online Mar. 9, 2015), 6 pages.
Lindsay "The promises and challenges of solid-state sequencing." Nature nanotechnology 11.2 (Feb. 2016): 109-111.
Liu et al., "Electron spin studies of nitrogen vacancy centers in nanodiamonds," Acta Physica Sinica 62(16) 164208: 1-5 (Aug. 2013), 5 pages.
Liu et al., "Fiber-integrated diamond-based magnetometer," Applied Physics Letters 103(143105): 1-4 (Sep. 2013), 5 pages.
MacLaurin et al., "Nanoscale magnetometry through quantum control of nitrogen-vacancy centres in rotationally diffusing nanodiamonds," New Journal of Physics 15, (Jan. 2013), 16 pages.
MacQuarie et al., "Mechanical spin control of nitrogen-vacancy centers in diamond," Retrieved from http://www.arxiv.org/pdf/1306.6356.pdf, pp. 1-8, (Jun. 2013), 8 pages.
Macs et al., "Diamond as a magnetic field calibration probe," Journal of Physics D: Applied Physics 37, (Apr. 2004; published Mar. 17, 2004), 6 pages.
Maletinsky et al., "A robust scanning diamond sensor for nanoscale imaging with single nitrogen-vacancy centres," Nature Nanotechnology 7: 320-324, (May 2012; published Apr. 15, 2012), 5 pages.
Mamin et al., "Multipulse Double-Quantum Magnetometry with Near-Surface Nitrogen-Vacancy Centers," Physical Review Letters 13(030803): 1-5 (Jul. 2014), 5 pages.

(56) References Cited

OTHER PUBLICATIONS

Mamin et al., "Nanoscale Nuclear Magnetic Resonance with a Nitrogen-Vacancy Spin Sensor," Science 339, (Feb. 2013), 5 pages.
Manson et al., "GR transitions in diamond: magnetic field measurements," Journal of Physics C Solid St. Phys 13: L1005-L1009, (Nov. 1980), 6 pages.
Massachusetts Institute of Technology, "Wide-Field Imaging Using Nitrogen Vacancies," in Patent Application Approval Process, Physics Week: 1-5, (Jan. 20, 2015), 5 pages.
Matlashov, et al. "SQUIDs for magnetic resonance imaging at ultra-low magnetic field." PIERS online 5.5 (2009): 466-470.
Matlashov, et al. "SQUIDs vs. induction coils for ultra-low field nuclear magnetic resonance: experimental and simulation comparison." IEEE Transactions on Applied Superconductivity 21.3 (Jan. 1, 2012): 465-468.
Matsuda et al., "Development of a plastic diamond anvil cell for high pressure magneto-photoluminescence in pulsed high magnetic fields," International Journal of Modern Physics B 18(2729), (Nov. 2004), 7 pages.
Maze et al., "Nanoscale magnetic sensing using spin qubits in diamond," Proc. SPIE 7225, Advanced Optical Concepts in Quantum Computing, Memory, and Communication II, 722509 (Feb. 2, 2009) 8 pages.
Maze et al., "Nanoscale magnetic sensing with an individual electronic spin in diamond," Nature Physics 455: 644-647 (Oct. 2, 2008), 5 pages.
Meijer et al., "Generation of single color centers by focused nitrogen implantation," Applied Physics Letters 87(261909): 1-3 (Dec. 2005), 4 pages.
Michaelovich et al., "Polarization Dependencies of the Nitrogen-Vacancy Center." Undergraduate Project Report, Ben-Gurion University, Aug. 2015.
Millot et al., "High-field Zeeman and Paschen-Back effects at high pressure in oriented ruby," Physical Review B 78 (155125): 1-7 (Oct. 2008), 7 pages.
Moessle, et al. "SQUID-detected magnetic resonance imaging in microtesla fields." Annu. Rev. Biomed. Eng. 9 (May 23, 2008): 389-413.
Moriyama et al., "Importance of electron-electron interactions and Zeeman splitting in single-wall carbon nanotube quantum dots," Physica E 26: 473-476 (Feb. 2005), 4 pages.
Mrozek et al., "Circularly polarized microwaves for magnetic resonance study in the GHz range: Application to nitrogen-vacancy in diamonds," Applied Physics Letters, pp. 1-4 (Jul. 2015), 4 pages.
Nagl et al., "Improving surface and defect center chemistry of fluorescent nanodiamonds for imaging purposes—a review," Analytical and Bioanalaytical Chemistry 407: 7521-7536 (Oct. 2015; published online Jul. 29, 2015), 16 pages.
Neumann et al., "Excited-state spectroscopy of single NV defects in diamond using optically detected magnetic resonance," New Journal of Physics 11(013017): 1-10, (Jan. 2009), 11 pages.
Nizovtsev & Kilin, "Optically Detected Magnetic Resonance Spectra of the 14NV-13C Spin Systems in Diamond: Analytical Theory and Experiment," Doklady of the National Academy of Sciences of Belarus, (2013), 27 pages with English machine translation.
Nizovtsev et al., "Modeling fluorescence of single nitrogen-vacancy defect centers in diamond," Physica B—Condensed Matter, 608-611 (Dec. 2001), 4 pages.
Nizovtsev et al., "Theoretical study of hyperfine interactions and optically detected magnetic resonance spectra by simulation of the C-291(NV)H-(172) diamond cluster hosting nitrogen-vacancy center," New Journal of Physics 16(083014): 1-21 (Aug. 2014), 22 pages.
Nobauer et al., "Smooth optimal quantum control for robust solid state spin magnetometry," Retrieved from http://www.arxiv.org/abs/1412.5051, pp. 1-12, (Dec. 2014), 12 pages.
Notice of Allowance dated Jun. 8, 2017, from related U.S. Appl. No. 15/351,862, 7 pages.
Nowodzinski et al., "Nitrogen-Vacancy centers in diamond for current imaging at the redistributive layer level of Integrated Circuits," Microelectronics Reliability 55: 1549-1553 (Aug. 2015), 5 pages.
Nusran et al., "Optimizing phase-estimation algorithms for diamond spin magnetometry," Physical Review B 90(024422): 1-12 (Jul. 2014), 12 pages.
Ohashi et al., "Negatively Charged Nitrogen-Vacancy Centers in a 5 nm Thin 12C Diamond Film," Nano Letters 13: 4733-4738 (Oct. 2013), 6 pages.
Pelliccione, et al., Two-dimensional nanoscale imaging of gadolinium spins via scanning probe relaxometry with a single spin in diamond, Phys. Rev. Applied 2.5, (Sep. 8, 2014): 054014 pp. 1-17.
Plakhotnik et al., "Super-Paramagnetic Particles Chemically Bound to Luminescent Diamond : Single Nanocrystals Probed with Optically Detected Magnetic Resonance," Journal of Physical Chemistry C 119: 20119-20124 (Aug. 2015), 6 pages.
Polatomic. "AN/ASQ-233A Digital Magnetic Anomaly Detective Set." Retrieved May 9, 2016, from http://polatomic.com/images/DMAD_Data_Sheet_09-2009.pdf (2009), 1 page.
Poole, "What is GMSK Modulation—Gaussian Minimum Shift Keying." Radio-Electronics, retrieved from https://web.archive.org/web/20150403045840/http://www.radio-electronics.com/info/rf-technology-design/pm-phase-modulation/what-is-gmsk-gaussian-minimum-shift-keyingtutorial.php (Apr. 3, 2015), 4 pages.
Qiu et al., "Low-field NMR Measurement Procedure when SQUID Detection is Used," IEEE/CSC & ESAS European Superconductivity News Forum, No. 5, Jul. 2008.
Qiu, et al. "SQUID-detected NMR in Earth's magnetic field." Journal of Physics: Conference Series. vol. 97. No. 1. IOP Publishing, Mar. 2008, pp. 1-7.
Rabeau et al., "Implantation of labelled single nitrogen vacancy centers in diamond using 15N," Applied Physics Letters 88, (Jan. 2006), 4 pages.
Ranjbar et al., "Many-electron states of nitrogen-vacancy centers in diamond and spin density calculations," Physical Review B 84(165212): 1-6 (Oct. 2011), 6 pages.
Reynhardt, "Spin-lattice relaxation of spin-1/2 nuclei in solids containing diluted paramagnetic impurity centers. I. Zeeman polarization of nuclear spin system," Concepts in Magnetic Resonance Part A, pp. 20-35, (Sep. 2003), 16 pages.
Rogers et al., "Singlet levels of the NV(-) centre in diamond," New Journal of Physics 17, (Jan. 2015), 13 pages.
Rondin et al., "Magnetometry with nitrogen-vacancy defects in diamond," Reports on Progress in Physics 77(056503) 1-26 (May 2014), 27 pages.
Rondin et al., "Magnetometry with nitrogen-vacancy defects in diamond." May 22, 2014 (May 22, 2014), pp. 1 [online] http://arxiv.org/pdf/1311.5214.pdf, 29 pages.
Rondin et al., "Nanoscale magnetic field mapping with a single spin scanning probe magnetometer," Applied Physics Letters 100, (Apr. 2012), 5 pages.
Sarkar et al., "Magnetic properties of graphite oxide and reduced graphene oxide," Physica E 64: 7882 (Nov. 2014), 5 pages.
Scheuer et al., "Accelerated 2D magnetic resonance spectroscopy of single spins using matrix completion," Scientific Reports 5(17728): 1-8 (Dec. 2015), 8 pages.
Schirhagl et al., "Nitrogen-vacancy centers in diamond: Nanoscale sensors for physics and biology," Annual Review of Physical Chemistry 65: 83-105 (Jan. 2014), 26 pages.
Schoenfeld & Harneit, "Real time magnetic field sensing and imaging using a single spin in diamond," Physical Review Letters 106(030802): 1-4 (Jan. 2011), 4 pages.
Sedov et al., "Si-doped nano- and microcrystalline diamond films with controlled bright photoluminescence of silicon-vacancy color centers," Diamond and Related Materials 56: 23-28 (Jun. 2015; available online Apr. 18, 2015), 6 pages.
Shames et al., "Magnetic resonance tracking of fluorescent nanodiamond fabrication," Journal of Physics D: Applied Physics 48(155302): 1-13 (Apr. 2015; published Mar. 20, 2015), 14 pages.

(56) References Cited

OTHER PUBLICATIONS

Shao et al., "Diamond Color Center Based Fm Microwave Demodulator," in Conference on Lasers and Electro-Optics, OSA Technical Digest (online) (Optical Society of America), paper JTh2A.136, (Jun. 5-10, 2016), 2 pages.
Sheinker et al., "Localization in 3-D Using Beacons of Low Frequency Magnetic Field." IEEE Transactions on Instrumentation and Measurement 62(12): 3194-3201 (Dec. 2013), 8 pages.
Simanovskaia et al., "Sidebands in optically detected magnetic resonance signals of nitrogen vacancy centers in diamond," Physical Review B 87(224106): 1-11 (Jun. 2013), 11 pages.
Sotoma et al., "Effective production of fluorescent nanodiamonds containing negatively-charged nitrogen-vacancy centers by ion irradiation," Diamond and Related Materials 49: 33-38 (Oct. 2014), 6 pages.
Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.
Steiner et al., "Universal enhancement of the optical readout fidelity of single electron spins at nitrogen-vacancy centers in diamond," Physical Review B 81(035205): 1-6 (Jan. 2010), 6 pages.
Steinert et al., "High-sensitivity magnetic imaging using an array of spins in diamond," Rev. Sci. Inst. 81(043705): 1-5 (Apr. 23, 2010), 5 pages.
Steinert et al., "Magnetic spin imaging under ambient conditions with sub-cellular resolution." Nature Comms 4:1607 (Mar. 19, 2013).
Stepanov et al., "High-frequency and high-field optically detected magnetic resonance of nitrogen-vacancy centers in diamond," Applied Physics Letters 106, (Feb. 2015), 5 pages.
Sternschulte et al., "Uniaxial stress and Zeeman splitting of the 1.681 eV optical center in a homoepitaxial CVD diamond film," Diamond and Related Materials 4: 1189-1192 (Sep. 1995), 4 pages.
Storteboom et al., "Lifetime investigation of single nitrogen vacancy centres in nanodiamonds," Optics Express 23(9): 11327-11333 (May 4, 2015; published Apr. 22, 2015), 7 pages.
Sushkov, et al. "All-optical sensing of a single-molecule electron spin." Nano letters 14.11 (Nov. 7, 2013): 6443-6448.
Tahara et al., "Quantifying selective alignment of ensemble nitrogen-vacancy centers in (111) diamond," Applied Physics Letters 107:193110 (Nov. 2015; published online Nov. 13, 2015), 5 pages.
Taylor et al., "High-sensitivity diamond magnetometer with nanoscale resolution," Nature Physics 4: 810-816 (Oct. 2008), 7 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
Terblanche et al., "13C spin-lattice relaxation in natural diamond: Zeeman relaxation at 4.7 T and 300 K due to fixed paramagnetic nitrogen defects," Solid State Nuclear Magnetic Resonance 20: 1-22 (Aug. 2001), 22 pages.
Terblanche et al., "13C spin-lattice relaxation in natural diamond: Zeeman relaxation in fields of 500 to 5000 G at 300 K due to fixed paramagnetic nitrogen defects," Solid State Nuclear Magnetic Resonance 19: 107-129 (May 2001), 23 pages.
Tetienne et al., "Magnetic-field-dependent photodynamics of single NV defects in diamond: an application to qualitative all-optical magnetic imaging," New Journal of Physics 14(103033): 1-5 (Oct. 2012), 16 pages.
Tetienne, et al. "Spin relaxometry of single nitrogen-vacancy defects in diamond nanocrystals for magnetic noise sensing." Physical Review B 87.23 (Apr. 3, 2013): 235436-1-235436-5.
Tong et al., "A hybrid-system approach for W state and cluster state generation," Optics Communication 310: 166-172, (Jan. 2014; available online Aug. 12, 2013), 7 pages.
Uhlen et al., "New diamond nanofabrication process for hard x-ray zone plates," J. of Vacuum Science & Tech. B 29(6) (06FG03): 1-4 (Nov./Dec. 2011), 4 pages.

U.S. Notice of Allowance dated Apr. 20, 2016, from related U.S. Appl. No. 15/003,718, 9 pages.
U.S. Notice of Allowance dated Aug. 17, 2016, from related U.S. Appl. No. 15/003,718, 8 pages.
U.S. Notice of Allowance dated Dec. 13, 2016, from related U.S. Appl. No. 14/680,877, 8 pages.
U.S. Notice of Allowance dated Dec. 22, 2016, from related U.S. Appl. No. 14/659,498, 10 pages
U.S. Notice of Allowance dated Feb. 14, 2017, from related U.S. Appl. No. 15/003,677, 8 pages.
U.S. Notice of Allowance dated Jun. 20, 2017, from related U.S. Appl. No. 15/204,675, 9 pages.
U.S. Notice of Allowance dated Jun. 28, 2017 from related U.S. Appl. No. 15/003,256, 10 pages.
U.S. Notice of Allowance dated Jun. 29, 2017 from related U.S. Appl. No. 15/351,862, 4 pages.
U.S. Notice of Allowance dated Mar. 15, 2017, from related U.S. Appl. No. 15/351,862, 6 pages.
U.S. Notice of Allowance dated Mar. 29, 2016, from related U.S. Appl. No. 15/003,590, 11 pages.
U.S. Notice of Allowance dated May 26, 2017 from related U.S. Appl. No. 15/218,821, 7 pages.
U.S. Notice of Allowance dated Sep. 8, 2016, from related U.S. Appl. No. 15/003,298, 10 pages.
U.S. Office Action dated Apr. 17, 2017, from related U.S. Appl. No. 15/003,558, 12 pages.
U.S. Office Action dated Aug. 24, 2016 from related U.S. Appl. No. 14/676,740, 19 pages.
U.S. Office Action dated Feb. 10, 2017, from related U.S. Appl. No. 14/676,740, 20 pages.
U.S. Office Action dated Feb. 10, 2017, from related U.S. Appl. No. 15/003,088, 11 pages.
U.S. Office Action dated Feb. 16, 2017, from related U.S. Appl. No. 15/204,675, 7 pages.
U.S. Office Action dated Jul. 29, 2016 from related U.S. Appl. No. 14/680,877, 8 pages.
U.S. Office Action dated Jun. 1, 2017, from related U.S. Appl. No. 15/003,797, 29 pages.
U.S. Office Action dated Jun. 1, 2017, from related U.S. Appl. No. 15/179,957, 29 pages.
U.S. Office Action dated Jun. 12, 2017, from related U.S. Appl. No. 15/003,256, 9 pages.
U.S. Office Action dated Jun. 12, 2017, from related U.S. Appl. No. 15/003,336, 14 pages.
U.S. Office Action dated Jun. 16, 2017, from related U.S. Appl. No. 15/003,678, 15 pages.
U.S. Office Action dated Mar. 1, 2017, from related U.S. Appl. No. 15/003,634, 7 pages.
U.S. Office Action dated Mar. 16, 2017, from related U.S. Appl. No. 15/218,821, 7 pages.
U.S. Office Action dated May 13, 2016, from related U.S. Appl. No. 14/676,740, 15 pages.
U.S. Office Action dated May 22, 2017, from related U.S. Appl. No. 15/003,206, 12 pages.
U.S. Office Action dated May 6, 2016, from related U.S. Appl. No. 14/659,498.
U.S. Office Action dated Nov. 2, 2016, from related U.S. Appl. No. 15/003,256, 19 pages.
U.S. Office Action dated Nov. 3, 2016, from related U.S. Appl. No. 15/204,675, 9 pages.
U.S. Office Action dated Oct. 14, 2016 from related U.S. Appl. No. 15/003,677, 13 pages.
U.S. Office Action dated Oct. 19, 2016, from related U.S. Appl. No. 15/218,821, 6 pages.
Vershovskii & Dmitriev, "Combined excitation of an optically detected magnetic resonance in nitrogen-vacancy centers in diamond for precision measurement of the components of a magnetic field vector," Technical Physics Letters 41(11): 1026-1029 (Nov. 2015), 4 pages.
Vershovskii & Dmitriev, "Micro-scale three-component quantum magnetometer based on nitrogen-vacancy color centers in diamond crystal," Technical Physics Letters 41(4): 393-396 (Apr. 2015), 4 pages.

(56) References Cited

OTHER PUBLICATIONS

Wahlstrom et al., "Modeling Magnetic Fields Using Gaussian Processes," 2013 IEEE International Conference on Acoustics, Speech, and Signal Processing, pp. 3522-3526 (May 26-31, 2013), 5 pages.

Wang et al., "Optimizing ultrasensitive single electron magnetometer based on nitrogen-vacancy center in diamond," Chinese Science Bulletin, 58(24): 2920-2923, (Aug. 2013), 4 pages.

Webber et al., "Ab initio thermodynamics calculation of the relative concentration of NV- and NVO defects in diamond," Physical Review B 85,(014102): 1-7 (Jan. 2012), 7 pages.

Wells, et al. "Assessing graphene nanopores for sequencing DNA." Nano letters 12.8 (Jul. 10, 2012): 4117-4123.

Widmann et al., "Coherent control of single spins in silicon carbide at room temperature," Nature Materials, 14: 164-168 (2015) (available online Dec. 1, 2014), 5 pages.

Wolf et al., "Subpicotesla Diamond Magnetometry," Physical Review X 5(041001): 1-10 (Oct. 2015), 10 pages.

Wolfe et al., "Off-resonant manipulation of spins in diamond via precessing magnetization of a proximal ferromagnet," Physical Review B 89(180406): 1-5 (May 2014), 5 pages.

Wroble, "Performance Analysis of Magnetic Indoor Local Positioning System." Western Michigan University Master's Theses, Paper 609 (Jun. 2015), 42 pages.

Wysocki et al., "Modified Walsh-Hadamard sequences for DS CDMA wireless systems." Int. J. Adaptive Control and Signal Processing 16(8): 589-602 (Oct. 2002; first published online Sep. 23, 2002), 25 pages.

Xue & Liu, "Producing GHZ state of nitrogen-vacancy centers in cavity QED," Journal of Modern Optics 60(6-7), (Mar. 2013), 8 pages.

Yang & Gu, "Novel calibration techniques for high pulsed-magnetic fields using luminescence caused by photo," (with English machine translation), Journal of Huazhong University of Science and Technology, (Jun. 2007), 11 pages.

Yavkin et al., "Defects in Nanodiamonds: Application of High-Frequency cw and Pulse EPR, ODMR," Applied Magnetic Resonance, 45: 1035-1049 (Oct. 2014; published online Sep. 10, 2014), 15 pages.

Yu et al., "Bright fluorescent nanodiamonds: No photobleaching and low cytotoxicity," J. Am. Chem. Soc., 127: 17604-17605 (Nov. 25, 2005), 2 pages.

Zhang et al., "Laser-polarization-dependent and magnetically controlled optical bistability in diamond nitrogen-vacancy centers," Physics Letters A 377: 2621-2627 (Nov. 2013), 7 pages.

Zhang et al., "Laser-polarization-dependent spontaneous emission of the zero phonon line from single nitrogen-vacancy center in diamond," Chinese Physics B 24(3), (Apr. 2014), 13 pages.

Zhang et al., "Scalable quantum information transfer between nitrogen-vacancy-center ensembles," Annals of Physics, 355: 170-181 (Apr. 2015; available online Feb. 14, 2013), 12 pages.

Zhao et al., "Atomic-scale magnetometry of distant nuclear spin clusters via nitrogen-vacancy spin in diamond," Nature Nanotechnology, 5: 242-246 (Apr. 2011), 5 pages.

International Search Report and Written Opinion from related PCT application PCT/US2017/035315 dated Aug. 24, 2017, 7 pages.

Ramsey, et al., "Phase Shifts in the Molecular Beam Method of Separated Oscillating Fields", Physical Review, vol. 84, No. 3, Nov. 1, 1951, pp. 506-507.

U.S. Notice of Allowance on U.S. Appl. No. 14/676,740 dated Sep. 1, 2017, 7 pages.

U.S. Notice of Allowance on U.S. Appl. No. 15/003,206 dated Sep. 18, 2017, 11 pages.

U.S. Notice of Allowance on U.S. Appl. No. 15/003,281 dated Sep. 26, 2017, 7 pages.

U.S. Office Action on U.S. Appl. No. 15/003,176 dated Sep. 27, 2017, 8 pages.

U.S. Office Action on U.S. Appl. No. 15/003,292 dated Sep. 8, 2017, 8 pages.

\* cited by examiner

MAPPING AND MONITORING OF HYDRAULIC FRACTURES USING VECTOR MAGNETOMETERS

CROSS-REFERENCE TO RELATED APPLICATIONS

This application is a continuation of co-pending U.S. patent application Ser. No. 14/659,498 filed Mar. 16, 2015, which claims the benefit of priority under 35 U.S.C. §119 from U.S. Provisional Patent Application 61/955,918 filed Mar. 20, 2014, both of which are incorporated herein by reference in their entirety.

FIELD OF THE INVENTION

The present invention generally relates to process control, more particularly, to mapping and monitoring of hydraulic fractures using vector magnetometers.

BACKGROUND

In recent decades, an increasing trend used by the oil and gas industry for producing natural gas from unconventional resource plays has been the application of hydraulic fracturing, or fracking. Examples of unconventional plays include tight sand formations containing natural gas, and shale reservoirs, such as the Marcellus shale formation located in the Northeastern United States.

Fracking involves the introduction of a fracking fluid at high pressure into a formation to cause stress fractures in the surrounding formation. This increases the permeability of the formation, thereby allowing more of the natural gas trapped within the formation to be collected. After fracturing, a proppant is introduced to keep open the resultant fractures. Fracking has proven to be revolutionary to the natural gas industry, and proponents of fracking believe it to be a major step for reducing dependence on foreign sources of natural gas. However, opponents claim that fracking fluid may contaminate ground water and often propose greater restrictions and better regulated procedures than those currently employed. The oil and gas industry has responded to concerns by attempting to map out the induced fracture network in conjunction with the use of "friendlier" fracking fluids. By mapping the induced fracture network, information may be obtained regarding the extension of the induced fractures and the proximity of the induced fractures to other underground features, such as underground faults. If induced fractures reach a natural fault that extends toward the surface, frac fluid may be able to migrate upward, approaching more shallow underground features such as the aquifer.

In an attempt to map induced fractures in typical fracking systems, micro-seismic arrays are arranged on the surface or placed down hole, and configured to listen for "pops" which occur when induced shear fractures intersect with existing natural fractures. Release of energy associated with the pops or seismic events travels via elastic wave propagation to an array of geophones (e.g., receivers) which are used to triangulate the location of the event or hypocenter. The seismic data is collected and triangulation calculations are performed to locate the source of the seismic activity. However, seismic sensors suffer from reduced sensitivity due to very weak signals and the attenuation of seismic signals by natural fractures. Additionally, there is a high degree of uncertainty in the measurement of micro-seismic activity due to the inability to know a priori when a fracture event is going to occur. The seismic monitoring approach is also known as passive micro-seismic monitoring, in which the term passive refers to the lack of controlled energy input resulting from the use of explosives, air guns, or thumpers for reflection seismic surveys. Because there is no controlled energy input, the event time for a shear pop is unknown. Thus, there are more unknowns to solve for and the mapping problem is more difficult. Also, there may be overlapping pops, which complicate the process of sorting out the seismic return signals (e.g. first arrivals).

Another approach involves the placement of very sensitive tilt meters which act like a carpenter's level to measure movement of the earth's surface due to expansion and shifting of subsurface formations due to the introduction of a pressurized fluid and the resulting induced fracture network.

Still another approach has been suggested in which radioactive isotopes are added to the fracking fluid and subsequently monitored using gamma ray spectrometry. However, this approach introduces additional potentially dangerous substances into the ground, where the trend is toward less invasive materials. These known methods fail to relate any information regarding proppant injected into induced fractures during hydraulic fracturing. For example, rock may be fractured under pressure, but the fractures may close once the source of force against the fracture is removed or reduced. Therefore, even if the known methods perform as intended, a true picture of the induced fracture network is not obtained. Alternative methods and systems for mapping induced hydraulic fractures are desired.

SUMMARY

In some aspects, a method for mapping and monitoring of hydraulic fracture includes capturing, using an array of sensors, a first magnetic image of a well pay zone. A second magnetic image is captured using the array of sensors, after a well bore is padded with a fluid. A background is established based on the first and the second magnetic images. A third magnetic image is captured using the array of sensors, after a doped proppant is injected into a stage. The third image is processed to subtract the background and to obtain information regarding distribution of the fluid and the proppant in the stage.

In another aspect, a system for mapping and monitoring of hydraulic fracture includes an array of sensors and a processor. The array of sensors is configured to capture magnetic images including a first magnetic image of a well pay zone, and a second magnetic image including a magnetic image captured after a well bore is padded with a fluid. The processor is configured to provide a background image based on the first and the second magnetic images. A third magnetic image is captured by the array of sensors after a doped proppant is injected into a stage. The processor is configured to process the third magnetic image to subtract the background and to obtain information regarding distribution of the fluid and the proppant in the stage.

In yet another aspect, a method includes capturing a first image of a well pay zone, capturing a second image after a well bore is padded with a fluid, providing a background image based on the first and the second images, capturing a third image after a doped proppant is injected into a stage, and processing the third image to subtract the background and to obtain information regarding distribution of the fluid and the proppant in the stage. The first, second, and third images comprise magnetic images.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The present disclosure is directed, in part, to mapping and monitoring of hydraulic fractures using vector magnetometers. Magnetic images are capture at various phases of the hydraulic fracturing operation (also referred to as "fracking"), which include padding and injection of fracking (frac) fluid and proppant, as described in more detail herein. The subject technology allows monitoring and adjustment of the fracking operation by providing a map of the distribution of the frac fluid and proppant in various stages.

The disclosed solution can be used in conjunction with micro-seismic monitoring. Micro-seismic monitoring is very challenging due to the fact that initial times for the shear fracture events are unknown, which results in large uncertainty in the depth migration problem of seismic processing. Other limiting factors include observation of only shear fractures, and the fact that fracture events themselves don't indicate whether or not the induced fracture was effectively propped open subsequent to removal of pressurized frac fluid.

The subject solution provides indication of proppant penetration into the fracture network during and subsequent to the frac process, which is the key to better controlling the overall fracking process. Fracking is typically a multiple stage or zonal process per each well. The disclosed solution also enables adapting initial frac plan to evolving conditions.

Figure 1A:
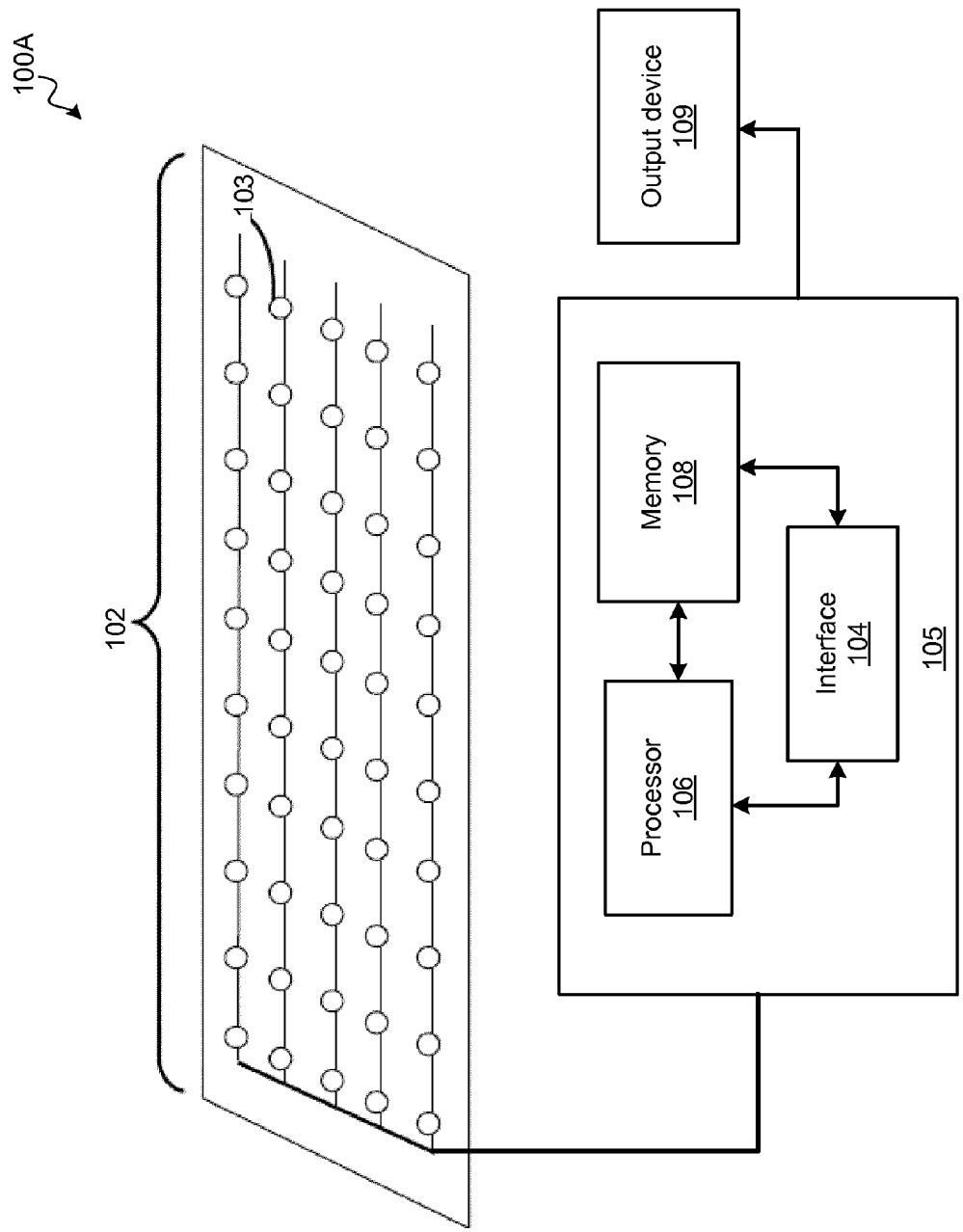
FIGS. 1A-1B are diagrams illustrating examples of a high-level architecture of a system for mapping and monitoring of hydraulic fracture and an environment where the system operates, according to certain embodiments.
Figure 1B:
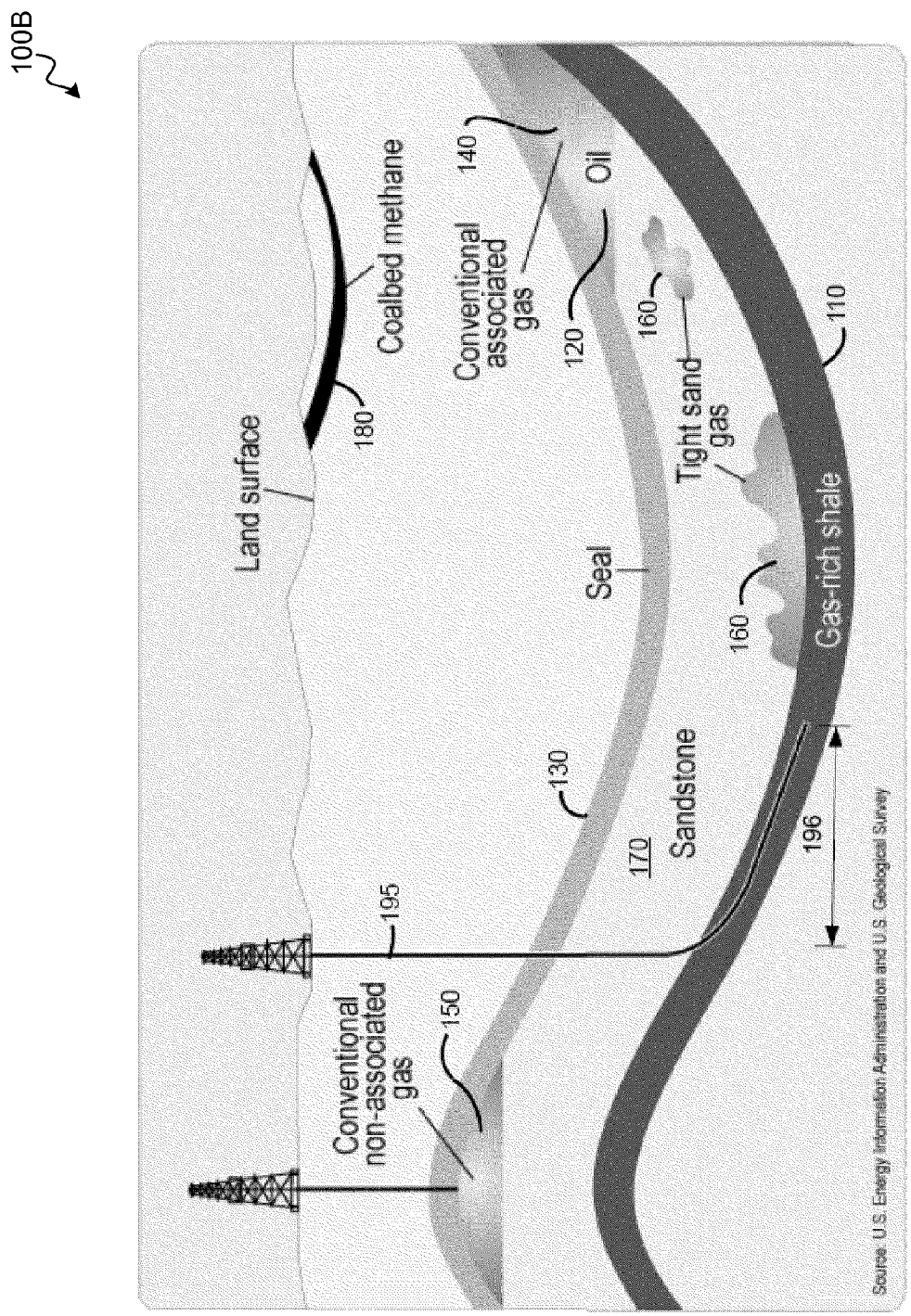

FIGS. 1A-1B are diagrams illustrating examples of a high-level architecture of a system 100A for mapping and monitoring of hydraulic fracture and an environment 100B where the system operates, according to certain embodiments. The system 100A includes a sensor array 102 including multiple sensors 103, an analyzer 105, and an output device 109. Each sensor 103 includes at least a magnetometer communicatively coupled to the analyzer 105. The analyzer 105 includes one or more processors 106, memory 108 and an interface 104. Each sensor may communicate data signal to the analyzer 105. The communication between the sensors and the analyzer 105 may be wired, optical, or wireless communication. The analyzer 105 may communicate with the sensors 103 individually or with the sensor array 102 through the interface 104 to receive sensor data. The analyzer 105 may store the sensor data received from the sensors 103 or the sensor array 102 to the memory 108. The stored data may be accessed by processor(s) 106 for processing the data subsequent to the sensors storing their respective data. The processor(s) 106 may be configured to receive executable instructions for processing the data according to the constrained geophysical processing described herein. The signals produced by the sensor array 102 may include magnetic imaging data for generation of a magnetic profile of a region defined by the well which is intended to be processed using hydraulic fracturing. Each magnetometer sensor 103 may save its vector field measurement every few minutes throughout the entire fracking process. All saved data is time tagged by some simple means such as a common clock or a trigger for later processing of the data.

The memory 108 is in communication with processor 106 and the interface 104. Memory 108 may store information, such as the sensor array 102 signals received by the analyzer 105. Further, memory 108 may store magnetic images or signals that have been received from sensor array 102 and further processed by processor(s) 106. The interface 104 communicates data from the analyzer 105 to an output device 109. The output device 109 may be any device or apparatus that can communicate information about the processed signals received from sensor array 102. For example, the output device 109 may be a display configured to display a graphical depiction of a well site, including a mapping of an induced fracture network produced during hydraulic fracturing. In some aspects, the output 517 may be a printing device providing information (e.g. reports) relating to a hydraulic fracturing operation.

In one or more implementations, the sensors 103 are arranged in a sensor array 102 and communicatively connected to analyzer 105. The sensors 103 may include a magnetometer for measuring a magnetic field in the proximity of the sensor 103, which is communicated to the analyzer 105. The magnetic fields measured by sensor array 102 may be related to a well being processed using hydraulic fracturing. The magnetic field measured by the sensors 103 may include magnetic fluences relating to the Earth's magnetic field, as well as remnant magnetism in the rock formation and magnetic properties of the well apparatus itself, such as the well casing. As the well is fractured by injecting fluid and proppants into the well bore at selected stages along the bore, the magnetic field in the region of the hydraulic fluids and proppants affect the surrounding magnetic fields that are subsequently measured by the sensors 103. As hydraulic fracturing proceeds in the well, subsequent magnetic images are captured by the sensor array 102 and communicated to the analyzer 105. The received magnetic images are processed by processor(s) 106 to determine changes in the magnetic profile between successive magnetic images captured by the sensor array 102. The changes are processed to map the distribution of frac fluid and proppant in the well, which are indicative of the induce fracture network into which the fluid and proppant has flowed during hydraulic fracturing.

FIG. 1B shows the environment 100B, which is representation of the geology of natural gas resources. The growth of natural gas reserves and production from shale formations has sparked interest in the nation's natural gas resources. The diagram in FIG. 1B shows the geologic nature of most major sources of natural gas in the United States in schematic form. Gas rich shale 110 is the source rock for many natural gas resources, but until recently, has not been a focus for production. Horizontal drilling and hydraulic fracturing have made shale gas an economically viable alternative to conventional gas resources. Conventional gas accumulations 140, 150, or plays, occur when gas migrates from gas-rich shale into an overlying sandstone formation, and then becomes trapped by an overlying impermeable formation, called the seal 130. Associated gas 140 accumulates in conjunction with oil 120, while non-associated gas 150 does not accumulate with oil. Tight sand gas accumulations 160 occur when gas migrates from a source rock into a sandstone formation 170, but is limited in its ability to migrate upward due to reduced permeability in the sandstone. Finally, coal bed methane 180 does not originate from shale, but is generated during the transformation of organic material to coal.

Conventional gas accumulations 140, 150 may be accessed via horizontal drilling techniques in which the well bore is substantially vertical. To access non-conventional plays such as gas-rich shale formations 110, horizontal drilling techniques in which the well bore 195 extends substantially horizontally 196 may be needed. Generally, the permeability of unconventional reservoirs is too low for production, thus requiring directional drilling and well stimulation. For example, the permeability of a typical shale formation may be on the order of $10^{-9}$ Darcy. Tight sand formations may have permeability of about $10^{-6}$ Darcy. In contrast, a conventional play may have permeability of $10^{-2}$ Darcy.

Figure 2:
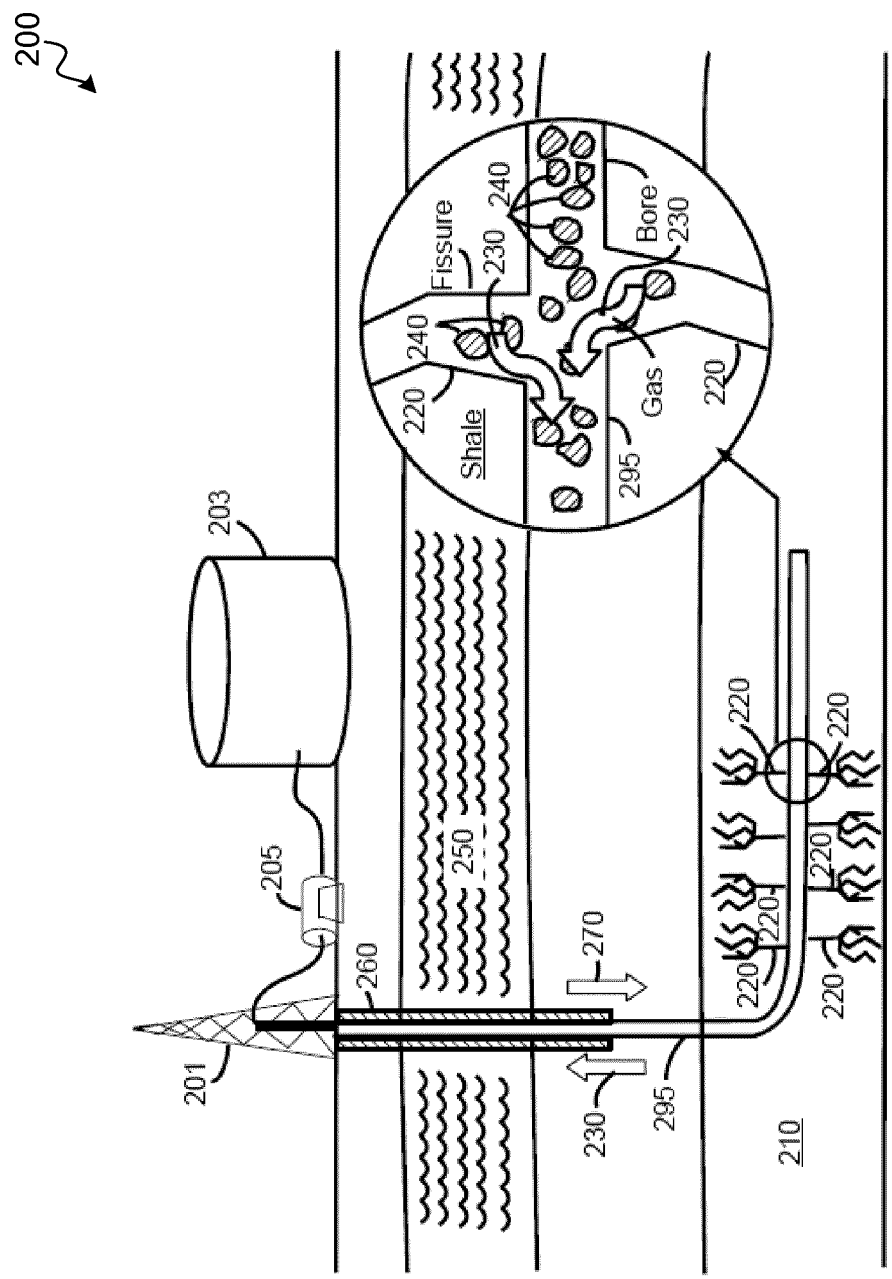
FIG. 2 is a high-level diagram illustrating an example of implementation of hydraulic fracturing of a well to release gas reserves, according to certain embodiments.

FIG. 2 is a high-level diagram illustrating an example of implementation of hydraulic fracturing of a well to release gas reserves, according to certain embodiments. A well head 201 is installed at ground level and attached to a water supply from a storage container 203 via a pump 205. The pump provides a frac fluid at a sufficient pressure in the well bore 295 to produce fracturing of the underlying shale layer 210. Natural gas trapped within the natural fissures 220 in the shale layer 210 are released as the newly formed fractures expand existing fissures while creating newly induced fractures and pathways through the remaining shale formation 210.

Shale is a finely grained sedimentary form of rock. Spaces between the grains are typically very small. As natural gas is formed, some of the gas becomes trapped within these small spaces. Using conventional mining and drilling techniques these trapped resources are difficult to access. Despite the resource richness of these sources, the production from wells in these types of formations has proven to be economically infeasible. Yet despite the inability to access the trapped gas due to the high impermeability of the shale, the shale contains a high volume of pore space that may contain substantial amounts of gas collected over long geological timeframes. Hydraulic fracturing provides access to this pore space, allowing the trapped gas 230 migrate toward the well bore 295 and be collected at the well head 201.

Frac fluid is stored near the well head 201 in storage container 203. The frac fluid is provided to the well bore 295 under pressure provided by the pump 205. The frac fluid is primarily water, but other additives or chemicals may be added to the frac fluid. For example, water pumped into the shale layer 210 at pressure, creates new fractures in the grains of the shale formation. When the pressure is relieved, such as by turning off the pump 205, the newly formed cracks in the shale tend to reclose under the pressure caused by the mass of the overlying layers. To maintain the openings created by the hydraulic pressure, a substance called a proppant 240 is added to the frac fluid. The proppant 240 props open the newly formed cracks 220 to allow the trapped natural gas 230 to migrate toward the well bore 295. The proppant 240 typically includes sand, which has a compressibility sufficient to maintain the openings in the shale, while providing enough permeability to allow the migration of the natural gas within the shale formation. While frac sand is a commonly used proppant, other materials, for example, aluminum beads, ceramic beads, sintered bauxite and other materials may be used, provided the material is crush-resistant and provides adequate permeability.

Other materials or chemicals may be added to frac fluid to provide additional functionality. For example, thickening agents may be added to the frac fluid to form a gel, which is effective at carrying the proppant particles deep into the rock formation. Other chemicals may be added to reduce friction, maintain rock debris from the fracking process in suspension for ease of removal, prevent corrosion of equipment, kill bacteria, control pH, as well as perform other functions.

The frac fluid is introduced to the well bore 295 under pressure (as indicated by arrow 270) and enters the natural fissures 220 located within the shale layer 210. Hydrostatic pressure builds in the shale until the pressure creates force which exceeds the tensile strength of the shale grains causing the grains to fracture and split. The entire well bore 295 does not need to be pressurized. Plugs may be placed beyond the regions of shale being targeted for fracturing to produce the desired pressure within a targeted region or stage.

The well bore 295 may extend from the surface for thousands of feet to reach the shale layer 210 below. Overlying layers, include the aquifer 250 which may provide the water supply for the area surrounding the well 200. To protect the water supply from contamination, the well bore 295 is lined with a steel casing 260. The space between the outside of the steel casing 260 and the walls of the well bore 295 are then filled with concrete to a depth greater than the aquifer 250. As the well bore 295 approaches the depth containing the gas-rich shale formation 210, the well bore 295 is angled to a horizontal or nearly horizontal direction to run longitudinally through the shale formation 210. As the pressurized frac fluid is applied to the shale layer 210 the existing fissures 220 are expanded and newly formed fractures are created. As shown in detail in the inset of FIG. 2, the frac fluid and proppant 240 enter the existing fissures 220 and create new fissures. Proppant particles 240 contained in the frac fluid hold the fissures open and provide permeability for gas 230 located within the fissures to migrate through the frac fluid and proppant particles to the well bore 295 and back to the surface.

During production of a non-conventional play, a horizontal pay zone extending about 4,000 feet through the pay zone may be established. Fracturing is performed along the horizontal pay zone in typically uniform stages extending about 400 feet. For a typical fractured well, 10-20 million square feet of additional surface area is created by the fractures. The fracking is performed beginning at the toe or end of the well, and processed stage by stage back toward the well opening. Fracking a typical well requires about 2.5 million pounds of proppant and about 4-6 million gallons of frac fluid. The fracturing process seeks to push proppant radially out from the well bore into the formation up to 1,000 feet. Ideally, fractures create sheet-like openings that extend orthogonally to the direction of the well bore. To this end, wells are typically drilled based on prior knowledge of the in situ stress state of the rock formation. Spacing for the fracturing stages are selected based, at least in part, on the anticipated induced fracture and empirically determined flow rates into the fracture network to ensure that production is commensurate with the intended 20-30 year life expectancy of a typical well installation. A production field may contain a number of wells configured as described above. The wells are spaced according to the corresponding designed pay zone of each well. The use of hydraulic fracturing is intended to maximize the stimulated rock volume (SRV) per dollar cost of production.

Experience has shown, however, that induced fractures define complicated networks of fractures rather than the ideal sheet-like openings. Accordingly, mapping the occurrence and location of actual fractures becomes valuable in determining the effectiveness of the current operations, and provides insight into future actions to maximize production efficiency of the well. Factors that create uncertainty in the hydraulic fracturing process include the loss of frac fluid and proppants to pre-existing or natural fractures which may open further during the fracking process. Injected fluid and proppant is accommodated, (e.g., space/volume become available) by the compliance of the surrounding rock which becomes compressed, and thereby alters the rock's stress state. This changes the stress field from one stage's fracture to the next. This results in added uncertainty as to the final placement of proppants to maintain openings formed by the fracking after the hydraulic pressure is removed.

Mapping induced fractures caused by hydraulic fracturing allows for greater production and maximized stimulated reservoir volume (SRV). In addition, concerns expressed over the process of fracking, including the proliferation of the fracking materials into the environment, may require accurate mapping of induced fractures and the introduction of frac fluids and proppants to those fractures to meet further regulatory requirements designed to control and regulate impact to the environment caused by hydraulic fracturing.

Presently, attempts at mapping fractures include passive micro-seismic monitoring. In micro-seismic monitoring, a passive array of seismic sensors is arranged at the surface overlying the fractured pay zone, or the sensors may be placed down hole in the fracked well or in a nearby observation well. The seismic sensors are configured to detect shear pops that occur when an induced tensile crack intersects with a natural fracture which emits a popping type of impulse. The impulses are converted to signals which are processed to determine the source of the impulse. Micro-seismic monitoring is passive. That is, no active seismic signal is generated and used to create returned signals. The sensors merely monitor the surroundings for seismic activity if and when such activity occurs. Since it not known when a fracture may be induced by the hydraulic pressure, or where such fractures may occur, there is considerable uncertainty in seismic monitoring. This uncertainty is compounded by the very low energy seismic signals which must be detected. Further, seismic monitoring does not provide insight as to the effective placement of proppants, as the impulses used to generate signals occur at the initiation of an induced fracture and do not indicate if the fractures were successfully propped open, or reclosed after the initial fracture. Therefore, it is difficult to verify that the mapping information generated is reliable. The subject solution may be used alone or in cooperation with existing techniques including micro-seismic monitoring.

According to one or more implementations, an array of sensors is placed on or near the surface of a well or active pay zone. The array of sensors includes at least a magnetometer sensor for measuring a magnetic field around the sensor. In an alternative embodiment, one or more of the magnetometer sensors may be placed down hole in the well, although this is not a requirement and a system may be embodied using solely surface arrays. The environment around the well has a magnetic signature that may be measured by the sensor array. For example, the Earth's magnetic field will influence the overall magnetic signature in the area of the well. Additionally, remnant sources of magnetic fields, such as the host rock or intrusions of magnetite further influence the magnetic field sensed by the array of magnetometer sensors. Further, as the well casing is driven down in the well bore, the well casing tends to become magnetized, thereby affecting the magnetic field measured at the magnetometer sensor array.

According to an embodiment, a process includes placing an array of sensors proximate to a well pay zone. Prior to introducing any frac fluid for hydraulic fracturing, a baseline magnetic profile is established by measuring the magnetic signature prior to any hydraulic fracturing being performed. The baseline magnetic signature includes the Earth's magnetic field, remnant sources of magnetism in the earth and the magnetic field which is associated with the well casing. The magnetometer sensor may be based on a diamond nitrogen vacancy (DNV) sensor. A DNV sensor includes a synthetic diamond substrate which is created having intentional impurities introduced into the carbon lattice structure of the diamond. Nitrogen atoms replace the carbon atoms at varying locations in the lattice, thereby creating vacancies which contain electrons. The electrons have various spin states which may be measured. The spin states are sensitive to the surrounding magnetic environment. As the magnetic environment changes, the spin states of the electrons change and the difference in spin may be correlated to the corresponding change in the magnetic environment. Magnetometers based on DNV technologies are very sensitive and can detect small changes in magnetic fields in a sensor which is considerably smaller than other technologies. For example, a typical conventional magnetometer capable of detecting small changes in the magnetic profile of a well's pay zone may require a sensor which is the size of a small van. In contrast, a DNV based magnetometer may be embodied in a sensor the size of a cellular telephone or smaller. Thus, a number of small, very sensitive magnetometers can be carried on site and arranged in an array about the surface in the area defining the well pay zone.

Figure 3A:
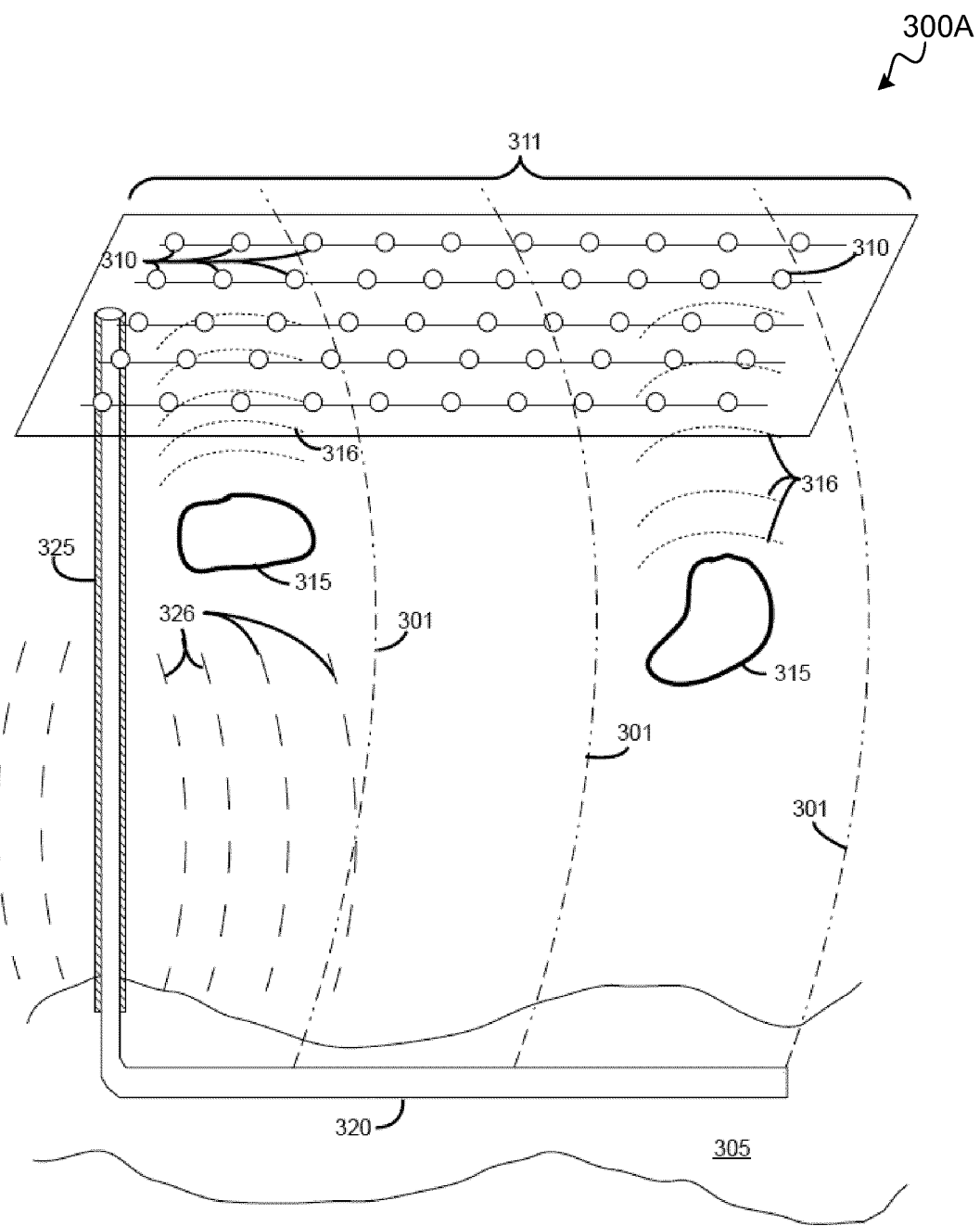
FIG. 3A is a diagram illustrating an example background magnetic signature of a well, according to certain embodiments.

FIG. 3A is a diagram illustrating an example background magnetic signature 300A of a well, according to certain embodiments. A well may include a bore 320 that is drilled vertically from the surface to a desired depth, at which point the bore 320 is extended horizontally along the pay zone. A well casing 325 is inserted into the bore to insulate the well bore 320 from the surrounding rock formation and to prevent introduction of mining materials into the surrounding rock near the surface. As the well casing 325 is driven into the rock formation, the casing tends to become magnetized and form the magnetic field 326. The surrounding rock formation contains naturally occurring remnant magnetism 316 which may be in the host rock or intrusions of other materials such as magnetite 315. In addition, the Earth has its own global magnetic field 301 that extends through the area defined by the well and its pay zone.

Figure 3B:
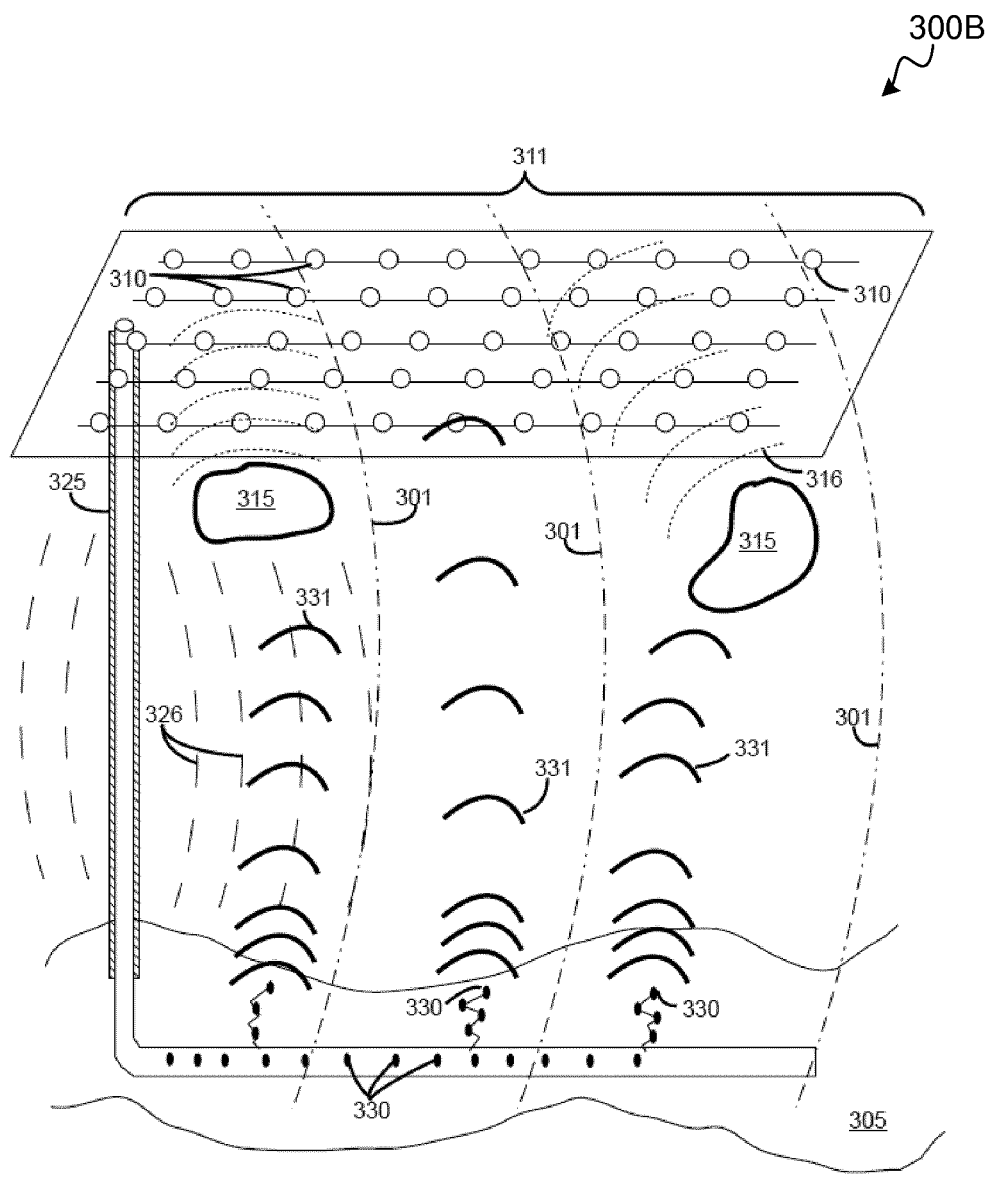
FIG. 3B is a diagram illustrating an example implementation of a mapping system for hydraulic fracturing of the well shown in FIG. 3A, according to certain embodiments.

FIG. 3B is a diagram illustrating an example implementation of a mapping system 300B for hydraulic fracturing of the well shown in FIG. 3A, according to certain embodiments. The mapping system 300B includes the sensor array 311 including magnetometer sensors 310 arranged on the surface in an area defining the pay zone of the well. According to some aspects, a one-to-one placement of magnetometers with geophones (e.g., for concurrent micro-seismic mapping) at the surface may be used. This configuration provides a wide aperture and allows for triangulating locations. The addition of magnetometer data requires minimal modification to procedures already established for micro-seismic techniques. Where the well is cased, monitoring the opened holes may involve introducing sensors at a subsurface level. Downhole placements of sensors may also be used to provide much stronger signals.

The sum of the magnetic fields created by the Earth's magnetic field 301, the remnant magnetism in the host rock 315, and additional magnetic influence of the mining materials, such as the well casing 326, define a baseline magnetic field of the well region which is measured by the array of magnetometers at the surface before any introduction of fracking material into the well bore 320. Frac fluid is introduced at high pressure to the well bore opening and the well bore 320 is filled with the fluid through the bore 320 to the toe of the well which initiates fractures in the rock. The fluid introduced prior to introducing proppant and other additives to the fluid is called padding. A typical well may receive millions of gallons of frac fluid in addition to millions of pounds of proppant 330. This large additional mass is received by the surrounding formation and may affect the surrounding magnetic signature. For this reason, the sensor array 311 may be configured to measure the baseline magnetic signature of the well adjusted for the additional mass provided by the padding fluid and proppant 330.

After the baseline magnetic signature has been measured, introduction of additional frac fluid and proppant 330 to the well may begin. The fluid is provided to the well in stages. A typical 4,000 foot horizontal pay zone may be hydraulically fractured in stages of about 400 feet at a time. In some aspects, the first stage is the length of the well bore 320 closest to the toe. Subsequent stages are processed sequentially, working from the toe back to the well opening. As the frac fluid is introduced to a new stage, the sensor array 311 measures the magnetic signature of the well pay zone region. The addition of the fluid causes hydraulic fracturing of the rock 305 surrounding the horizontal well bore in the area of the stage presently being processed. Changes from the baseline measured magnetic signature indicate the presence of the additional fluid and proppant 330 as it extends into the new induced fractures caused by the pressurized fluid. The changes may be monitored as subsequent stages are processed, with incremental changes in the measured magnetic signature being analyzed to provide insight into the progress and location of the newly formed fracture network.

To augment the information received at the sensor array as each stage is processed, the frac fluid and/or the proppant 330 may be treated or infused with a magnetically susceptible material. For example, small ferrite particles may be added to the proppant particles 330. The ferrite particles have a greater effect on the overall magnetic signature of the area to which they are introduced due to their magnetic susceptibility. According to some implementations, the proppant 330 is mixed with a magnetically susceptible material. In other implementations, the frac fluid may be mixed with the magnetically susceptible material, or both the fluid and the proppant 330 may be treated with the magnetically susceptible material. The differential magnetic signature is determined based on measuring the magnetic signature with the magnetometer sensor array after the magnetically susceptible proppant or fluid is added to a processing stage, and compared with the previous measured magnetic signatures measured prior to the addition of the proppant or fluid.

When adding a magnetic susceptible material to the frac fluid or the proppant 330, the material is selected such that the addition of the material does not substantially increase the weight of the proppant of fluid. Along the horizontal pay zone, fractures in the rock extend in varying directions in a web-like manner radially from the horizontal well bore. Therefore, as the well is hydraulically fractured, the frac fluid and proppant 330 must flow from the well bore in all radial directions, including upward against the force of gravity. If the added magnetically susceptible material adds too much weight to the fluid or the proppant 330, the heavier material will tend to settle due to gravity and not flow into the upward regions of the surrounding rock formation.

A sequence of changes in the passive magnetic images captured by the magnetometer sensors during the fracking process are used to determine the proppant placement. The frac fluid and/or the synthetic proppant may be doped with a magnetically susceptible material. Monitoring of the hydraulic fracturing process continues as multiple magnetic images are captured throughout the proppant injection phase. The background or baseline magnetic profile is removed from the images formed throughout the propping phase. Constrained geophysical processing of the resulting group of magnetic images provides information about the distributions of fluid and proppant.

Figure 4:
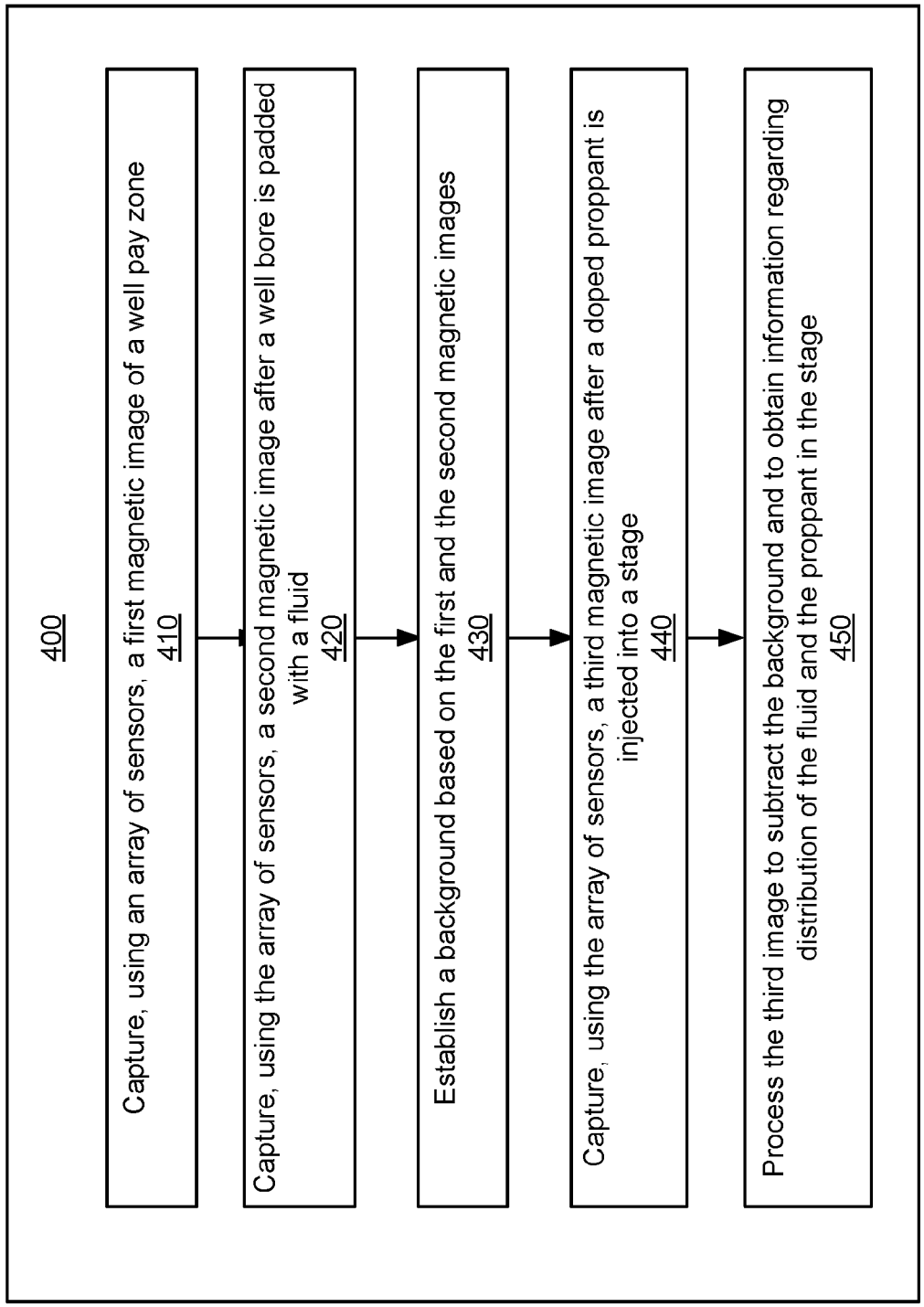
FIG. 4 is a diagram illustrating an example of a method for mapping and monitoring of hydraulic fracture, according to certain embodiments.

FIG. 4 is a diagram illustrating an example of a method 400 for mapping and monitoring of hydraulic fracture, according to certain embodiments. According to the method 400, using an array of sensors (e.g., 102 of FIG. 1A or 311 of FIG. 3A), a first magnetic image of a well pay zone (e.g., 200 of FIG. 2) is captured (410). Using the array of sensors, a second magnetic image is captured after a well bore (e.g., 295 of FIG. 2) is padded with a fluid (420). A background is established based on the first and the second magnetic images (430). Using the array of sensors, a third magnetic image is captured after a doped proppant (e.g., 240 of FIG. 2) is injected into a stage (e.g., 220 of FIG. 2) (440). The third image is processed to subtract the background and to obtain information regarding distribution of the fluid and the proppant in the stage (450).

Figure 5:
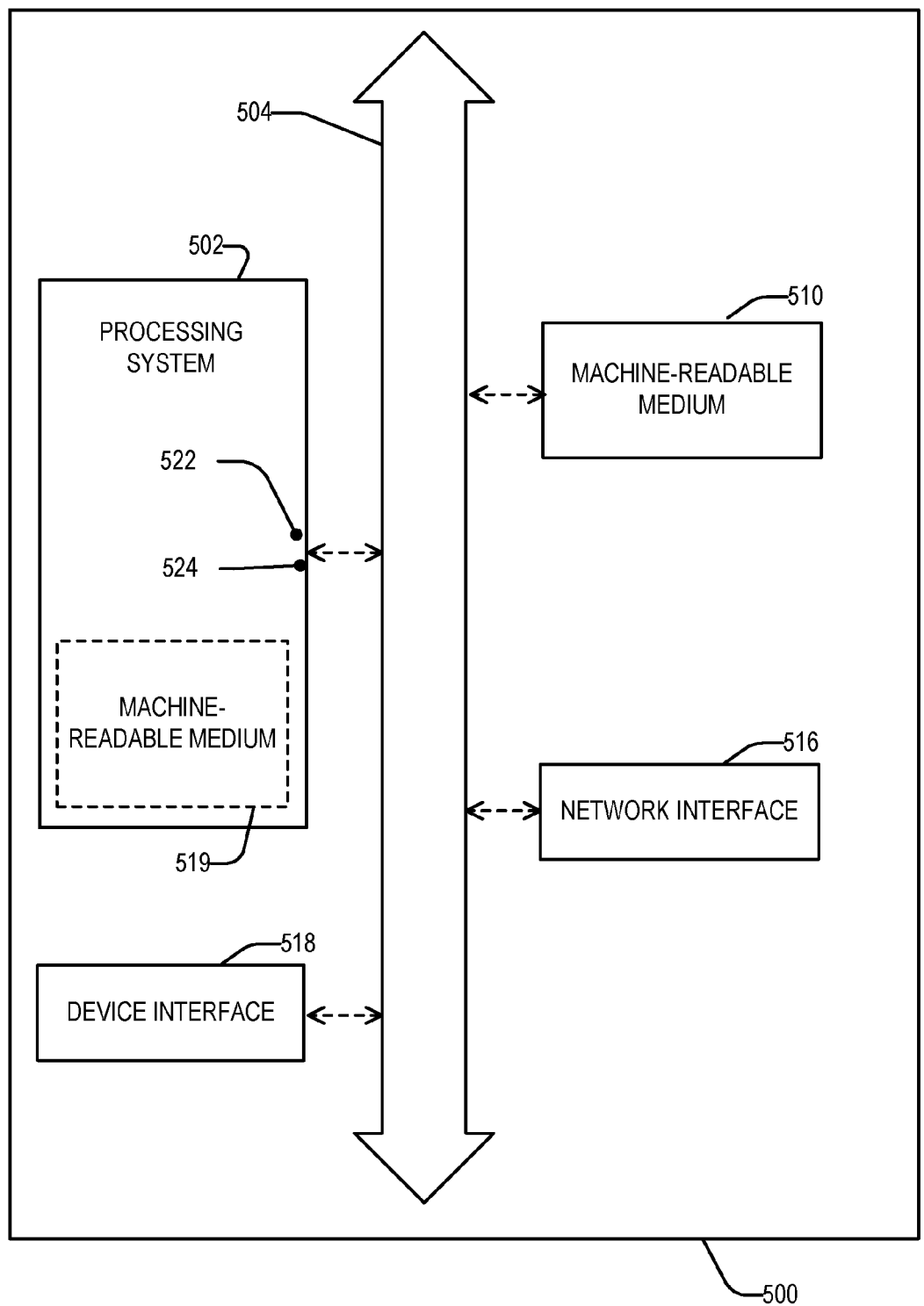
FIG. 5 is a diagram illustrating an example of a system for implementing some aspects of the subject technology.

FIG. 5 is a diagram illustrating an example of a system 500 for implementing some aspects of the subject technology. The system 500, for example, may be a system that the analyzer 105 of FIG. 1A is implemented on or may perform the functionalities of the analyzer 105 of FIG. 1A. In some implementations, the system 500 may perform simulations described herein. The system 500 includes a processing system 502, which may include one or more processors or one or more processing systems. A processor can be one or more processors. The processing system 502 may include a general-purpose processor or a specific-purpose processor for executing instructions and may further include a machine-readable medium 519, such as a volatile or non-volatile memory, for storing data and/or instructions for software programs. The instructions, which may be stored in a machine-readable medium 510 and/or 519, may be executed by the processing system 502 to control and manage access to the various networks, as well as provide other communication and processing functions. The instructions may also include instructions executed by the processing system 502 for various user interface devices, such as a display 512 and a keypad 514. The processing system 502 may include an input port 522 and an output port 524. Each of the input port 522 and the output port 524 may include one or more ports. The input port 522 and the output port 524 may be the same port (e.g., a bi-directional port) or may be different ports.

The processing system 502 may be implemented using software, hardware, or a combination of both. By way of example, the processing system 502 may be implemented with one or more processors. A processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable device that can perform calculations or other manipulations of information.

In one or more implementations, the transformation means (e.g., algorithms) and the signal processing of the subject technology may be performed by the processing system 502. For example, the processing system 502 may perform the functionality of the processor 106 of FIG. 1A or other or computational functions or simulations described herein.

A machine-readable medium can be one or more machine-readable media. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media (e.g., 519) may include storage integrated into a processing system such as might be the case with an ASIC. Machine-readable media (e.g., 510) may also include storage external to a processing system, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device. Those skilled in the art recognizes how best to implement the described functionality for the processing system 502. According to one aspect of the disclosure, a machine-readable medium is a computer-readable medium encoded or stored with instructions and is a computing element, which defines structural and functional interrelationships between the instructions and the rest of the system, which permit the instructions' functionality to be realized. Instructions may be executable, for example, by the processing system 502 or one or more processors. Instructions can be, for example, a computer program including code for performing methods of the subject technology.

A network interface 516 may be any type of interface to a network (e.g., an Internet network interface), and may reside between any of the components shown in FIG. 5 and coupled to the processor via the bus 504.

A device interface 518 may be any type of interface to a device and may reside between any of the components shown in FIG. 5. A device interface 518 may, for example, be an interface to an external device that plugs into a port (e.g., USB port) of the system 500.

Figure 6:
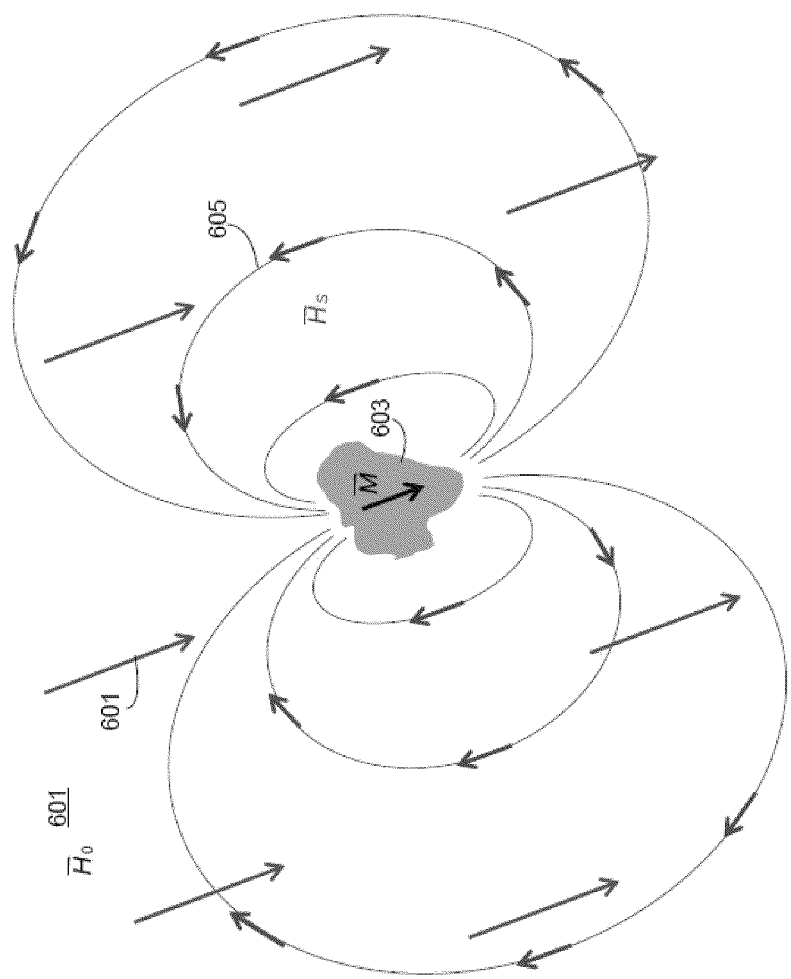
FIG. 6 is a diagram illustrating examples of primary and secondary magnetic fields in the presence of a doped proppant, according to certain embodiments.

FIG. 6 is a diagram illustrating examples of primary and secondary magnetic fields in the presence of a doped proppant, according to certain embodiments. According to an aspect of the disclosure, FIG. 6 depicts a scenario wherein proppant doped with magnetically susceptible matter 603 (e.g. the dopant) becomes magnetized and aligns with an external magnetic field, $\vec{H}_0$ 601. Such external magnetic field may consist of the Earth's natural (geomagnetic) field, as well as possibly that of the surrounding rocks having remnant magnetization, and a magnetized well casing. The external field 601 is commonly/synonymously referred to as the primary, background, or inducing field, which may be represented as a vector quantity having strength or magnitude, and direction.

Magnetization is also represented as a vector quantity, and the magnetization of the volume of doped proppant 603 depicted below is labeled $\vec{M}$. Upon becoming magnetized, the susceptible proppant 603 gives rise to an induced or secondary field 605, Hs. The induced field 605 is distinct from, but caused, by the primary field 601. The total magnetic field is then determined as the superposition of the primary field 601 and secondary field 605. In the simplest case (e.g. isotropic), magnetization relates to the total field by a scalar-valued susceptibility $\chi$, according to:

$$\vec{M} = \chi \vec{H} = \chi(\vec{H}_0 + \vec{H}_S) \qquad \text{Eq. (1)}$$

In a non-limiting embodiment, a standard approximation may be made which assumes the primary field 601 is significantly greater than the secondary field 605. Thus, the system's calculation may be made according to $\vec{M} \approx \chi \vec{H}_0$ and wherein the magnetization is parallel to the primary field 601 and is linearly proportional to it through the susceptibility at any given location.

Generally, the vector field at an observation or measurement point P due to a distribution of magnetized matter (e.g. doped proppant) within a source region $\Omega$ is given by:

$$\vec{H}(P) = \vec{H}_0(P) + \vec{H}_S(P) \qquad \text{Eq. (2)}$$
$$= \vec{H}_0(P) + \frac{1}{4\pi} \int\int\int_\Omega \vec{M}(\xi) \cdot \nabla \nabla \frac{1}{\rho(P, \xi)} d\Omega$$

Given the quantities as previously defined, and $\xi$ taking on all locations within the relevant source magnetic region. However, using the standard approximation this reduces to a model for the secondary field 605 depending on the susceptibility distributed throughout the relevant (i.e., non-negligible magnetic source) domain:

$$\vec{H}_S(P) = \frac{1}{4\pi} \int\int\int_\Omega \chi(\xi) \vec{H}_0(\xi) \cdot \nabla \nabla \frac{1}{\rho(P, \xi)} d\Omega \qquad \text{Eq. (3)}$$

The magnetic source domain for an embodiment of the disclosure comprises the subsurface region surrounding the well that is being fracked, and extending outward from the well to a distance greater than the proppant would reasonably be expected to reach.

If the primary field 601 existing prior to injecting any doped proppant or frac fluid is complicated by unknown but significant remnants, then Eq. (2) may be used and the magnetization vector may be solved. Alternatively, Eq. (3) may be used to solve for the scalar susceptibility distribution assuming the primary field vector is known throughout the domain of interest, which is taken to be Earth's geomagnetic background, and is well characterized. This approach may represent a simpler implementation.

Consistent with the assumptions stated above, the difference between DNV-based vector magnetic field measurements taken before and during the injection of doped proppant comprises a measure of the secondary field 605 modeled by Eq. (3) above, induced throughout the fracking process.

According to an aspect of the subject solution, the subsurface domain $\Omega$ surrounding the well is subdivided into many model "cells" that are right rectangular prisms of uniform size (other geometric shapes can be used but it is much less common). The unknown susceptibility of the material region associated with each model cell is taken to be constant. Cell sizes are chosen so that this approximation is reasonable, while also being large enough to keep the overall problem tractable (e.g. not too many cells), yet small enough to offer useful resolution (e.g. smooth variation) of the susceptibility being solved for.

After this discretization of the domain into many smaller discrete, uniform subdomain "cells," the susceptibilities for each cell being held constant can be removed from the volume integral and the integrals evaluated and arranged in a coefficient matrix (G) which multiplies the unknown susceptibilities (m) of each cell to compute secondary field values (d) that are expected to match the measured values. This forward model comprises a simple matrix-vector multiplication stated as:

$$d = Gm \qquad \text{Eq. (4)}$$

The influence coefficient (G) maps the susceptibility values of all cells in the modeled domain to magnetic field values at each measurement point. As there are many more cells in the model than there are measurement locations, this problem is severely underdetermined and has no unique solution (e.g. it has an infinite number of solutions). This is typical of geophysical inversion problems.

Regularized inversion provides a solution to this dilemma and is a mainstay of geophysics, wherein additional constraints are introduced to yield uniqueness and enable solving for the many unknowns. Types of constraints vary widely, ranging from totally artificial and mathematically contrived, to constraints that are very much physics-based and well applied to certain problems.

A general formulation that encapsulates most of these approaches comprises the simultaneous minimization of data misfit and constraint violation. Data misfit is the difference between measured data and modeled data reconstructed by the forward model of Equation (4) for a specified set of cell susceptibilities. This can be written as a scalar, two-term performance index or cost function:

$$\phi(m) = \phi_d(m) + \gamma \phi_m(m) \qquad \text{Eq. (5)}$$

where $\phi_d$ represents the data misfit term that takes on large values when a specified set of susceptibilities poorly reconstructs (via the forward model of Eq. (4)) the measured magnetic field values, and small values when the data is well matched. A quadratic form is common:

$$\phi_d(m) = (\tilde{d}-d)^T R^{-1} (\tilde{d}-d) \qquad \text{Eq. (6)}$$

where the tilde ($\tilde{\ }$) annotation indicates actual measured data and square matrix (R) is the measurement error covariance matrix associated with the data. Accordingly, individual data entries known to be very accurate may require being very closely matched by the reconstruction. Otherwise their mismatch produces large penalties.

The term $\phi_m$ is a model adjustment term that embodies problem constraints that give uniqueness to the problem while also providing physical insight to the problem being solved. A simple example for this term is one that takes on large values for specified susceptibilities that differ greatly from a-priori values (note the a-priori values are often zero, which for a hydraulic fracturing application implies no proppant is pushed into the geologic subdomain corresponding to a cell of the forward model). A simple quadratic form for this term is:

$$\phi_m(m) = (m_0 - m)^T W (m_0 - m) \qquad \text{Eq. (7)}$$

where $m_0$ comprises the a-priori susceptibilities of the cells one intends to keep the solution near, and the square matrix (W) reflects the possibly differential importance or preference of keeping certain cell values closer to their a-priori values than others. The non-diagonal entries of W may be represented as zero entries, wherein W is diagonal and hence symmetric. Diagonal entries of W are all positive-valued.

Returning to the overall performance index of Eq. (5), the second (model adjustment) term is weighted by a scalar ($\gamma$) to achieve a balance between the two terms. For example, ($\gamma$) is typically heuristically adjusted so the overall performance index is evenly apportioned between the data misfit and model adjustment terms.

Susceptibilities are then solved for the quadratic case as:

$$m = (G^T R^{-1} G + \gamma W)^{-1} (G^T R^{-1} \tilde{d} + \gamma W m_0) \qquad \text{Eq. (8)}$$

The above described solutions provide the benefit of being easy to solve. The model adjustment term may encapsulate the following constraints, which may be particularly useful for embodiments according to this specification: (1) The well geometry is known a-priori, so model cells outside the fracked stage and potentially its neighboring stages are unlikely to have significant changes in their susceptibility; (2) the total amount of susceptible matter pumped down the well is known and must be matched by the recovered model; (3) alternatively to the quadratic adjustment term of Eq. (7) allowing small adjustment of all susceptibilities, a so-called focused inversion may be implemented wherein only susceptibilities of a subset (e.g. minimum) number of model cells are allowed to change during the solution.

The geophysical inversion calculations may be implemented in hardware, software or a combination of hardware and software, for example by the processing system 502 of FIG. 5. A general purpose computer processor (e.g., 502 or processor 106 of FIG. 1A) for receiving magnetic and/or micro-seismic signals may be configured to receive and execute computer readable instructions. The instructions may be stored on a computer readable medium in communication with the processor. One or more processors may be used for calculation some or all of the magnetic and/or micro-seismic signals according to a non-limiting embodiment of the present disclosure.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology.

One or more of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. In one or more implementations, the computer readable media does not include carrier waves and electronic signals passing wirelessly or over wired connections, or any other ephemeral signals. For example, the computer readable media may be entirely restricted to tangible, physical objects that store information in a form that is readable by a computer. In one or more implementations, the computer readable media is non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Although the invention has been described with reference to the disclosed embodiments, one having ordinary skill in the art will readily appreciate that these embodiments are only illustrative of the invention. It should be understood that various modifications can be made without departing from the spirit of the invention. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

The invention claimed is:

1. A system for mapping and monitoring a hydraulic fracture, the system comprising:
   an array of sensors configured to capture a plurality of magnetic images comprising a first magnetic image comprising a magnetic image of a well pay zone of a well including a baseline magnetic profile including Earth's magnetic field, a second magnetic image comprising a magnetic image captured after the well pay zone is padded with a fluid, and a third magnetic image comprising a magnetic image after a doped proppant is injected into the well pay zone, each of the plurality of magnetic images comprising a set of one of more vector measurements using the array of sensors; and
   an analyzer in communication with the array of sensors and comprising a processor configured to determine a background image based on the first and the second magnetic images and to process the third magnetic image to subtract the background image to obtain information regarding a distribution of the fluid and the proppant in the well pay zone.

2. The system of claim 1, wherein the array of sensor comprises diamond nitrogen-vacancy (DNV) sensors.

3. The system of claim 2, wherein the doped proppant comprises a magnetically susceptible material.

4. The system of claim 3, wherein the magnetically susceptible material comprises ferrite particles.

5. The system of claim 1, wherein the array of sensors are placed proximate to the well pay zone.

6. The system of claim 1, wherein a sensor of the array of sensors is placed on a surface of the well pay zone.

7. The system of claim 1, wherein a sensor of the array of sensors is placed in a well of the well pay zone.

8. The system of claim 1, wherein the analyzer stores sensor data from the array of sensors.

9. The system of claim 1, wherein each of the plurality of magnetic images comprises a time tag.

10. The system of claim 1, wherein processing the third magnetic image comprises subdividing a subsurface domain surrounding the well pay zone into cells.

11. A system for mapping and monitoring a hydraulic fracture, the system comprising:
   means for capturing a plurality of magnetic images comprising a first magnetic image comprising a magnetic image of a well pay zone of a well including a baseline magnetic profile including Earth's magnetic field, a second magnetic image comprising a magnetic image captured after the well pay zone is padded with a fluid, and a third magnetic image comprising a magnetic image after a doped proppant is injected into the well pay zone; and
   means for determining a background image based on the first and the second magnetic images and processing the third magnetic image to subtract the background image to obtain information regarding a distribution of the fluid and the proppant in the well pay zone.

12. The system of claim 11, wherein the means for capturing a plurality of magnetic images comprises an array of magnetometers.

13. The system of claim 12, wherein the array of magnetometers comprises diamond nitrogen-vacancy (DNV) sensors.

14. The system of claim 11, wherein the fluid comprises a fracking fluid.

15. The system of claim 11, wherein at least one of the fluid or the proppant comprises a magnetically susceptible material.

16. The system of claim 11, wherein determining the background image based on the first and the second magnetic images comprises combining the first and the second magnetic images.

17. The system of claim 11, wherein each of the plurality of magnetic images comprise a set of one of more vector measurements.

18. A system for mapping and monitoring a hydraulic fracture, the system comprising:

magnetic image capturing means for capturing a plurality of magnetic images, the plurality of magnetic images comprising a first magnetic image comprising a magnetic image of a well pay zone of a well including a baseline magnetic profile including Earth's magnetic field and a second magnetic image comprising a magnetic image after a doped proppant is injected into the well pay zone; and magnetic image processing means for determining a distribution of fluid and proppant in the well pay zone.

19. The system of claim 18, wherein each of the plurality of magnetic images comprise a set of one of more vector measurements.

20. The system of claim 19, wherein the means for capturing a plurality of magnetic images comprises an array of diamond nitrogen-vacancy (DNV) sensors.

* * * * *